(12) United States Patent
Meinhold et al.

(10) Patent No.: US 10,044,005 B2
(45) Date of Patent: Aug. 7, 2018

(54) ELECTRODE, AN ELECTRONIC DEVICE, AND A METHOD FOR MANUFACTURING AN OPTOELECTRONIC DEVICE

(71) Applicant: Infineon Technologies Dresden GmbH, Dresden (DE)

(72) Inventors: Dirk Meinhold, Dresden (DE); Sven Schmidbauer, Dresden (DE); Markus Fischer, Bannewitz (DE); Norbert Urbansky, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 15/207,570

(22) Filed: Jul. 12, 2016

(65) Prior Publication Data

US 2016/0322610 A1 Nov. 3, 2016

Related U.S. Application Data

(62) Division of application No. 13/892,391, filed on May 13, 2013, now Pat. No. 9,419,181.

(51) Int. Cl.
| | |
|---|---|
| *H01L 51/56* | (2006.01) |
| *H01L 21/283* | (2006.01) |
| *H01L 29/45* | (2006.01) |
| *H01L 31/0224* | (2006.01) |
| *H01L 33/40* | (2010.01) |
| *H01L 51/52* | (2006.01) |
| *H01L 29/40* | (2006.01) |

(52) U.S. Cl.
CPC ............ *H01L 51/56* (2013.01); *H01L 21/283* (2013.01); *H01L 29/401* (2013.01); *H01L 29/45* (2013.01); *H01L 31/0224* (2013.01); *H01L 31/022425* (2013.01); *H01L 33/40* (2013.01); *H01L 51/5203* (2013.01); *H01L 51/5215* (2013.01); *H01L 51/5231* (2013.01); *H01L 2933/0016* (2013.01); *Y10T 428/12993* (2015.01); *Y10T 428/31678* (2015.04)

(58) Field of Classification Search
CPC ...... H01L 21/283; H01L 29/401; H01L 33/40
See application file for complete search history.

(56) References Cited

U.S. PATENT DOCUMENTS

| | | | | |
|---|---|---|---|---|
| 6,008,869 | A * | 12/1999 | Oana | G02F 1/136286 349/158 |
| 7,760,785 | B2 * | 7/2010 | Sasaoka | H01L 21/02389 257/103 |
| 2008/0315419 | A1 * | 12/2008 | Gaska | H01L 23/482 257/751 |
| 2009/0087645 | A1 * | 4/2009 | Mizuhara | C30B 23/00 428/332 |
| 2010/0006873 | A1 * | 1/2010 | Raring | H01L 27/153 257/90 |
| 2010/0133572 | A1 * | 6/2010 | Hirai | H01L 27/3246 257/98 |
| 2011/0266558 | A1 * | 11/2011 | Yano | H01L 21/0485 257/77 |

(Continued)

*Primary Examiner* — Caridad Everhart
*Assistant Examiner* — Ankush Singal
(74) *Attorney, Agent, or Firm* — Viering, Jentschura & Partner mbB

(57) ABSTRACT

According to various embodiments, an electrode may include at least one layer including a chemical compound including aluminum and titanium.

17 Claims, 15 Drawing Sheets

(56) References Cited

U.S. PATENT DOCUMENTS

2011/0291147 A1* 12/2011 Hu .................... H01L 33/40
                                                    257/99
2012/0258591 A1* 10/2012 Tamari ............. H01L 21/28575
                                                   438/654

* cited by examiner

FIG 1A
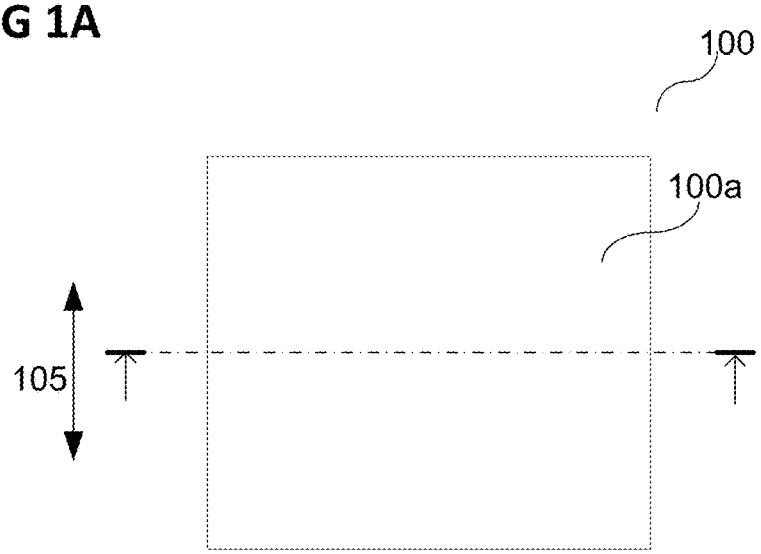
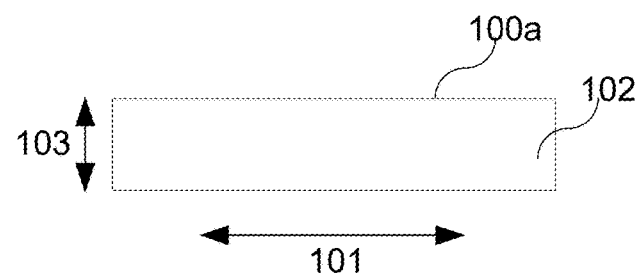
FIG 1B
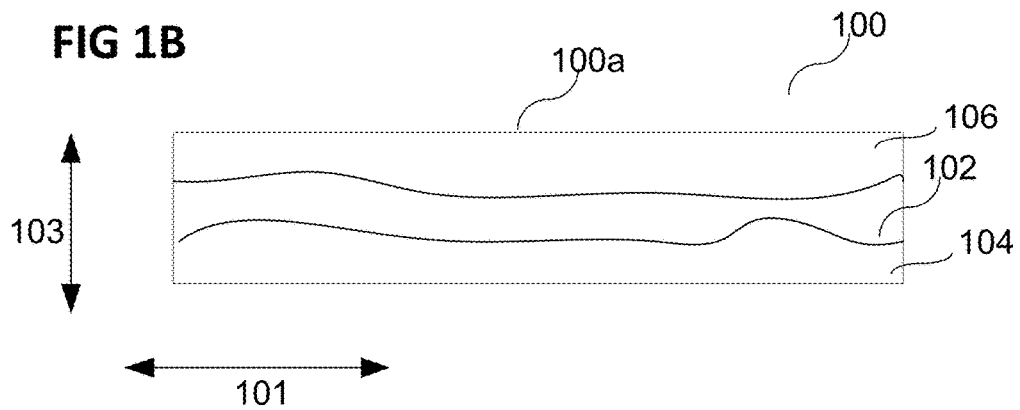

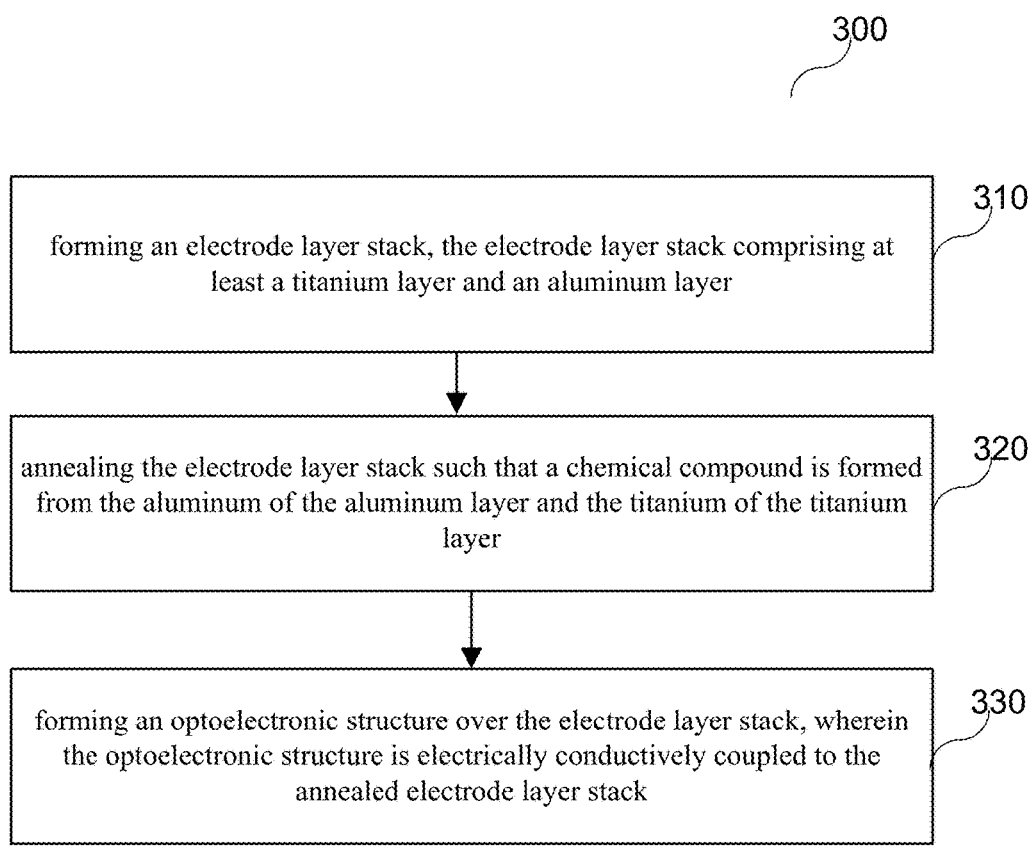

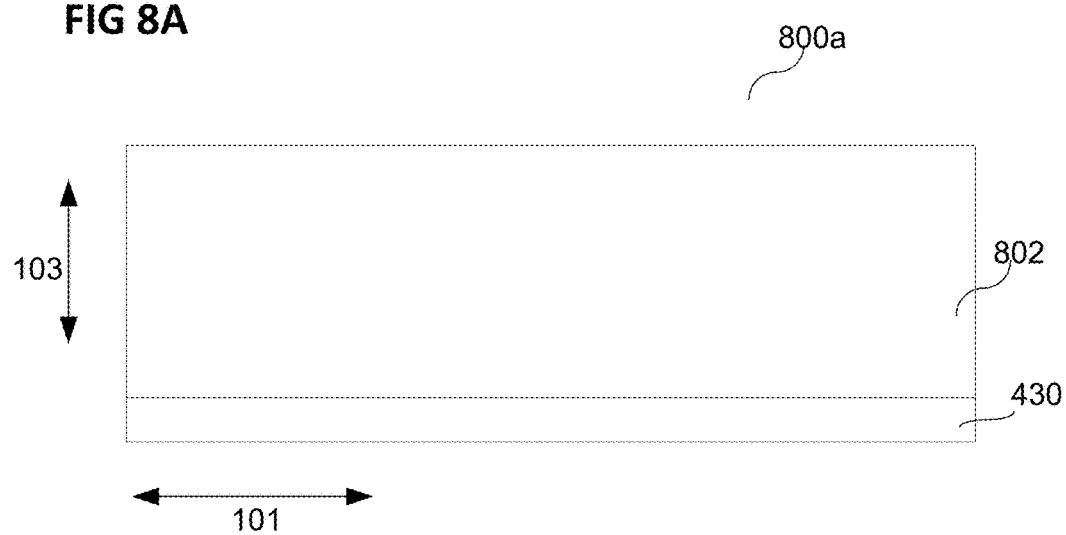
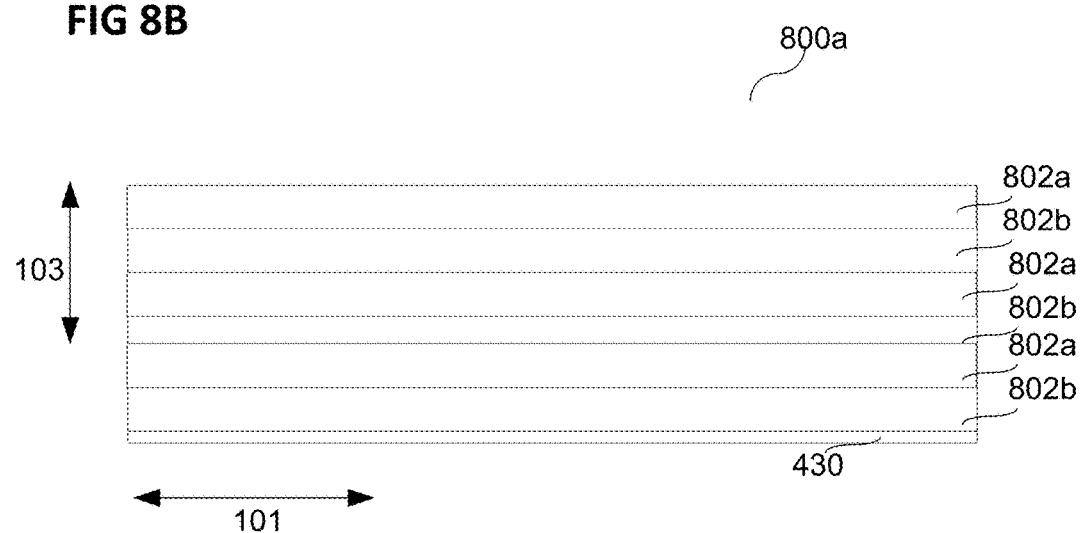

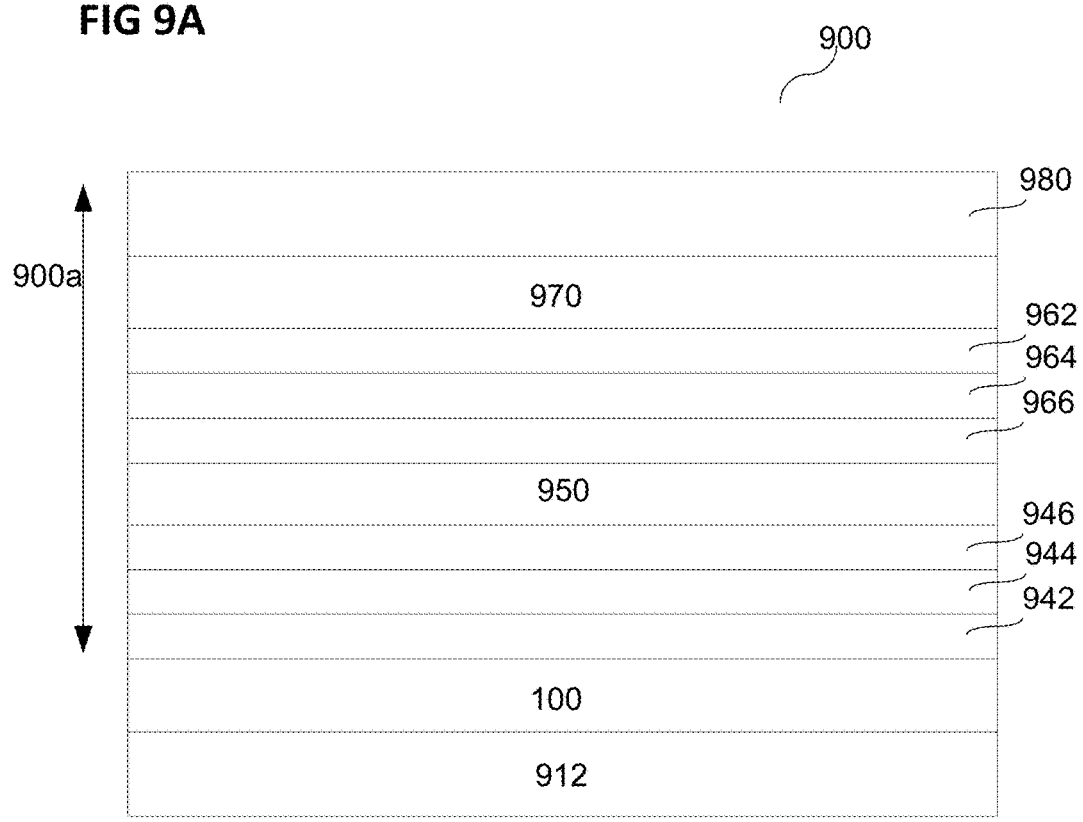

ELECTRODE, AN ELECTRONIC DEVICE, AND A METHOD FOR MANUFACTURING AN OPTOELECTRONIC DEVICE

CROSS-REFERENCE TO RELATED APPLICATIONS

The present application is a divisional of U.S. patent application Ser. No. 13/892,391 filed May 13, 2013, the entirety of which is herein incorporated by reference.

TECHNICAL FIELD

Various embodiments relate generally to an electrode, an electronic device, and a method for manufacturing an optoelectronic device.

BACKGROUND

In general, electronic devices may be manufactured using thin film deposition technology. Fabricating electronic devices, as for example optoelectronic devices, may be performed on wafer level using typical manufacturing processes of semiconductor industry, as for example layering, patterning, doping, polishing, plating and thermal treatments. Various electronic and optoelectronic devices may include functional layers or layer stacks, as for example semiconductor layers, electrode layers, barrier layers, charge transport layers and the like. Since the morphology of a formed layer may depend on a large number of independent and/or correlated parameters of the layering process (and the involved materials) and since the morphology of a formed layer may further influence the chemical and physical properties of the formed layer, forming functional layers of an electronic device providing the desired properties may be a challenging task.

SUMMARY

According to various embodiments, an electrode may be provided including at least one layer including a chemical compound including aluminum and titanium.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows an electrode in a schematic view, according to various embodiments;

FIGS. 1B to 1E show respectively an electrode in a cross sectional view, according to various embodiments;

FIG. 3 shows a schematic flow diagram of a method for manufacturing an optoelectronic device, according to various embodiments;

FIGS. 8A and 8B show schematically a cross sectional view of an electrode layer stack for example before an annealing step has been carried out, according to various embodiments;

FIGS. 9A and 9B show respectively a schematic cross sectional view of an optoelectronic structure dispose over the electrode, according to various embodiments;

DESCRIPTION

Figure 1C:
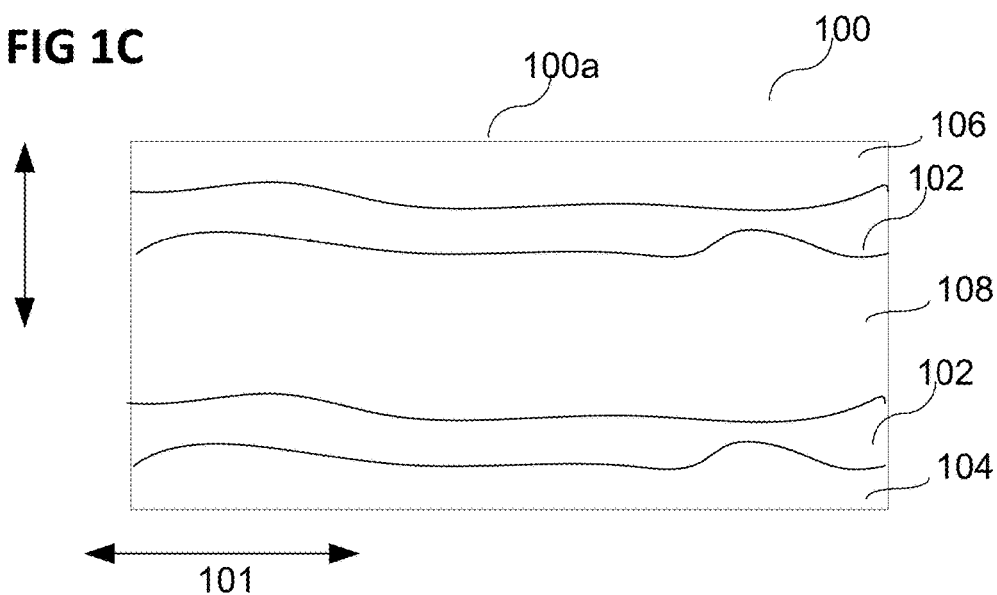

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In general, in semiconductor industry processes have been developed to provide high quality thin films (also referred as layers or thin layers), wherein the layers may be formed having for example the desired thickness and morphology, with a large range of desired properties, e.g. edge-covering behavior, electronic properties, and chemical properties. Thin film technology may enable the manufacturing of electronic devices, for example optoelectronic devices, which may be formed on a wafer or a carrier using processes of semiconductor industry. However, there may still arise problems in growing for example smooth layers of several materials, since depending on the materials to be deposited, the material used as substrate (or carrier), and the deposition conditions the layers may grow with a certain roughness.

In general there may be a large number of different deposition processes or layering processes, e.g. physical vapor deposition processes (PVD), chemical vapor deposition processes (CVD), galvanic processes or electroless deposition processes, which may be used to form (grow) a layer or thin film of a specific material.

Metals, metallic materials, and organic materials may for example grow in a so-called island-growth (Volmer-Weber growth) or a mixed growth including island growth (Stranski-Krastanov growth). For layering processes providing or including an island-growth of the deposited material, the surface roughness of the layer may be large compared to a layer by layer growth (Frank-van der Merwe growth). Further the island growth may cause a different microstructure and/or morphology of the deposited layer such that the physical properties of the grown layer may differ from a layer formed by using a layer by layer growth.

Therefore, it may be challenging to grow a smooth layer or thin film. However, the morphology and the microstructure of a thin film or a layer may influence and determine the physical (optical and electrical) properties of the thin film or layer. The control of the morphology and the microstructure during thin film growth may be beneficial in semiconductor processing, e.g. for layering processes, patterning processes, and the like. A substantial part of the morphology of a grown (formed or deposited) layer may be reflected in the surface roughness of the layer, wherein another aspect of the thin film growth may address the microstructure of the layer (e.g. grain size, grain boundaries, cracks, dislocations, defects, strain and the like). The surface roughness of a layer may be quantified by the vertical deviations of a real surface from the respective shape of the corresponding ideal form of the surface. The Roughness may be quantified as RMS-roughness (root-mean-squared-roughness), wherein the vertical deviations of the height (or thickness) of the thin film or layer may be correlated with the arithmetic value of the height or thickness.

In general, it may be difficult and expensive to control the surface roughness during manufacturing. On the one hand, decreasing the surface roughness may for example increase the manufacturing costs of the layers or devices including the smooth layers. On the other hand, decreasing the surface roughness may enhance the electrical and optical properties of the thin film or layer. Further, decreasing the surface roughness of a layer may enable the growth of smooth layers on top of the layer, such that the physical and chemical properties of a whole layer stack or a device may be enhanced, using a smoother layer as a primary layer. As described herein, a smoother layer or a smooth layer may have a smaller RMS roughness or a small RMS roughness compared to another layer, e.g. compared to commonly used or formed layers.

According to various embodiments, an electrode is described herein providing enhanced physical properties such as, for example, at least one of a low surface roughness, a dense microstructure, and a homogeneous microstructure. Therefore, the electrode provided herein, according to various embodiments, may provide a high reflectivity referring to the optical spectrum of the electromagnetic radiation, e.g. due to the low surface roughness, a high electrical conductivity and a high thermal conductivity, e.g. due to the dense microstructure. Further, according to various embodiments, the low surface roughness may enable the growth of additional layers on top of the electrode with a low surface roughness and an advantageous microstructure. According to various embodiments, the enhanced physical properties may result from the chemical compound used as electrode material and/or the manufacturing process, as described in the following.

According to various embodiments, an electrode may include at least one layer including a chemical compound including aluminum and titanium. According to various embodiments, the chemical compound may base on at least two metals, e.g. aluminum and titanium. According to various embodiments, the aluminum may include a small amount of copper, e.g. 0.5 mole percent or 0.5 weight percent.

According to various embodiments, an electrode may include at least one region including a chemical compound including aluminum and titanium. According to various embodiments, an electrode may include a plurality of regions including a chemical compound including aluminum and titanium.

According to various embodiments, the chemical compound including aluminum and titanium may be an aluminum/titanium intermetallic chemical compound, a so called titanium aluminide. According to various embodiments, an intermetallic compound may be a solid-state phases involving at least two metals, in this case for example titanium and aluminum forming titanium aluminide. According to various embodiments, the aluminum/titanium intermetallic chemical compound (the titanium aluminide) may include for example gamma-TiAl, alpha$_2$-Ti$_3$Al and TiAl$_3$. According to various embodiments the aluminum/titanium intermetallic chemical compound (the titanium aluminide) may include for example a compound with the chemical formula Ti$_x$Al$_y$, wherein x and y may be numbers defining the ration between titanium and aluminum.

According to various embodiments, the chemical compound including aluminum and titanium may be an aluminum/titanium alloy. According to various embodiments, the chemical compound including aluminum and titanium may include a solid solution of aluminum and titanium.

Since the two metals aluminum and titanium may form a number of complex solid phases, according to various embodiments, the chemical compound including aluminum and titanium may further be an interstitial intermetallic chemical compound including aluminum and titanium, a substitutional alloy including aluminum and titanium, an interstitial alloy including aluminum and titanium or a mixture of an alloy and a intermetallic chemical compound including aluminum and titanium.

According to various embodiments, the electrode, as described herein, may include a mixture of more than one solid phase of an aluminum and titanium intermetallic chemical compound and/or an aluminum/titanium alloy. Further, according to various embodiments, the physical and chemical properties of an aluminum and titanium intermetallic chemical compound and/or of an aluminum/titanium alloy may differ from the physical and chemical properties of the single metals aluminum and titanium.

According to various embodiments, the presence of titanium may prevent or disturb the crystal growth of the aluminum crystallites in the electrode layer occurring during the layering process or during an annealing process or a thermal treatment of the grown electrode layer.

FIG. 1A shows an electrode 100, according to various embodiments, including at least one layer 102 or at least one region 102, wherein the least one layer 102 or the at least one region 102 may include a chemical compound including aluminum and titanium, as described above. According to various embodiments, the electrode 100 may be a layer 102 (or a patterned layer) including a chemical compound including aluminum and titanium, as described above. In other words, the electrode 100 may be provided by a layer 102, e.g. a patterned or structured layer 102; or the layer 102, e.g. a patterned or structured layer 102 may be a part of the electrode 100.

According to various embodiments, the electrode 100 may have at least an upper surface 100a, as shown in FIG. 1A. The upper surface 100a may define two lateral directions 101 and 105 (width directions 101, 105), and a thickness direction 103 (height direction 103), wherein the thickness direction 103 may be perpendicular to the upper surface 100a and the lateral directions 101, 105 may be parallel to the upper surface 100a.

According to various embodiments, the lateral extension of the electrode 100 (the width) may be the extension of the electrode 100 along a width direction 101, 105 and the thickness of the electrode 100 (the height) may be the extension of the electrode 100 along the thickness direction 103.

According to various embodiments, the electrode 100 may have a thickness in the range from about several nanometers to about several micrometers, e.g. in the range from about 1 nm to about 10 µm, e.g. in the range from about 20 nm to about 600 nm, e.g. in the range from about 50 nm to about 400 nm. According to various embodiments, the thickness of the electrode 100 may be equal to or smaller than about 400 nm, e.g. equal to or smaller than about 300 nm, e.g. equal to or smaller than about 200 nm, e.g. equal to or smaller than about 100 nm.

According to various embodiments, the lateral extension of the electrode 100 may be in the range from about several nanometers to about several centimeter, e.g. in the range from about 1 nm to about 50 cm (or even up to meters), depending on the desired technical application. In general, the lateral extension of the electrode 100 may be limited by the size of the substrate used to deposit the electrode 100 and the type of layering process and accordingly the technical parameters for the specific type of layering process. According to various embodiments, the lateral extension of the electrode 100 (e.g. a single patterned electrode) to be used for example in display devices may be, for example, in the range from about 10 nm to about 30 µm, e.g. in the range from about 20 nm to about 10 µm, e.g. in the range from about 20 nm to about 1 µm.

According to various embodiments, the electrode 100 or the layer 102 may cover the surface of a semiconductor wafer or a semiconductor substrate.

According to various embodiments, a semiconductor substrate or a semiconductor wafer may be made of semiconductor materials of various types, including silicon, germanium, Group III to V or other types, including polymers, for example, although in another embodiment, other suitable materials can also be used. In an embodiment, the wafer substrate is made of silicon (doped or undoped), in an alternative embodiment, the wafer substrate is a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs).

According to various embodiments, the electrode 100 may be a patterned layer such that the electrode 100 may for example cover a substrate (or an underlying structure) in specific regions forming a desired electrode structure at least one of over and in a substrate. The shape of the electrode may be illustrated for example by the shape of the surface 100a, as shown in FIG. 1A. According to various embodiments, the electrode 100 may have prismatic shape (or a cylindrical shape), wherein the surface 100a of the electrode 100, as shown in FIG. 1A, may be the base area of the prism (or cylinder (not shown)). According to various embodiments, the base area 100a defining the shape of the electrode 100 and/or the shape of the electrode layer 102 may have a polygonal shape, a circular shape, an elliptical shape, a trigonal shape, a rectangular shape, a quadratic shape, a hexagonal shape, or any other desired shape. Further, according to various embodiments, the upper surface 100a of the electrode 100 may deviate from the planar shape shown in the figures included herein; instead the upper surface 100a may include more than one surface layer, wherein the surface layers of the more than one surface layer may form a more complex shape, e.g. a roof-shaped structure or spherical structure and the like, which may be patterned using for example at least one of a lithographic process and an etch process, as described herein.

An electronic device or an optoelectronic device may include at least one electrode. An electrode, as described herein may be an electrically conductive layer (or an electrically conductive region) which may provide charge carriers to another nonmetallic region of an electronic or an optoelectronic device. According to various embodiments, an electrode 100 may provide charge carriers to a semiconductor layer or semiconductor region (doped or undoped), to an electrolyte layer or region, to an organic compound (e.g. formed in a layer shape), or to a region or a layer including at least one of the following group of materials: an oxide, a nitride, a metal oxide, to a metal nitride, to a polymer and the like.

According to various embodiments, an electrode 100 may provide an electrode for a light emitting device or an optoelectronic device, as described later, therefore, an electrode, as described herein may be an electrically conductive layer (or an electrically conductive region) which may provide charge carriers, e.g. electrons or holes, to a functional layer of an light emitting device or an optoelectronic device, e.g. to a electroluminescence layer, light emitting layer, and/or a photodiode.

According to various embodiments, an electrode 100 may be configured as an anode, e.g. being positively charged, or as a cathode, e.g. being negatively charged. According to various embodiments, an electrode being configured as an anode may remove electrons from an electronic structure or device, or may inject holes into an electronic structure or electronic device; wherein an electrode being configured as a cathode may remove holes from an electronic structure or device, or may inject electrons into an electronic structure or electronic device.

According to various embodiments, the electrode 100 may include regions, wherein the chemical composition of the material may differ from the composition of the layer 102 including a chemical compound based one aluminum and titanium, as described before. Further, according to various embodiments, the electrode 100 may include additional regions or layers including for example at least one material of the following group of materials: titanium, aluminum, titanium nitride, titanium oxide, aluminum nitride, aluminum oxide.

As shown in FIG. 1B, the electrode 100 may include at least one layer 102, including a chemical compound based one aluminum and titanium, as described before. According to various embodiments, the electrode 100 may further include additional layers or regions, e.g. a first additional layer 104 and/or a second additional layer 106. According to various embodiments, the first additional layer 104 and/or the second additional layer 106 may include at least one material of the following group of materials: titanium, aluminum, titanium nitride, titanium oxide, aluminum nitride, aluminum oxide. According to various embodiments, the first additional layer 104 and/or the second additional layer 106 may include the same material as the layer 102, e.g. a titanium aluminide. According to various embodiments, the first additional layer 104 and/or the second additional layer 106 may include a titanium aluminide (or a titanium/aluminum alloy) having another chemical composition and/or another crystal structure than the titanium aluminide (or the titanium/aluminum alloy) included in layer 102. In other words, the electrode 100 may include a plurality of regions including for example at least one of titanium and aluminum, wherein at least one region 102 or layer 102 may include at least one of a titanium aluminide and a titanium/aluminum alloy.

Therefore, according to various embodiments, the electrode 100 may be composed of one material or more than one material, which may for example prevent, disturb or change the crystallization behavior of pure aluminum during an annealing process or heat treatment, such that the electrode 100 may not change its morphology, microstructure, and/or surface roughness during a heat treatment of the electrode.

According to various embodiments, the electrode 100 may be stable (e.g. may not form hillocks) up to a temperature of about 400° C. or even up to a higher temperature, since the titanium may change the crystallization behavior of aluminum. In contrast, a commonly used electrode including an aluminum layer may change its morphology, microstructure, and/or surface roughness during a heat treatment process, e.g. due to crystallization induced effects, e.g. due to hillock formation, e.g. due to dendrite formation.

According to various embodiments, as shown in FIG. 1B, at least one of the first additional layer 104 and the second additional layer 106 may have a higher concentration of titanium than the layer 102. Further, according to various embodiments, at least one of layer 102, the first additional layer 104 and the second additional layer 106 may include at least one of a titanium aluminide and a titanium/aluminum alloy. An electrode 100 may include at least one layer 102, 104, 106 including a chemical compound including aluminum and titanium, as described above.

According to various embodiments, as shown in FIG. 1C, at least one of the first additional layer 104 and the second additional layer 106 may have a higher concentration of titanium than the layer 102 and/or a third additional layer 108. Further, according to various embodiments, at least one of the layer 102, the first additional layer 104, the second additional layer 106 and the third additional layer 108 may include at least one of a titanium aluminide and a titanium/aluminum alloy. An electrode 100 may include at least one layer 102, 104, 106, 108 including a chemical compound including aluminum and titanium, as described above.

Referring to FIG. 1C, the additional layers 104, 106 may substantially include titanium or may be titanium layers, according to various embodiments. Further, according to various embodiments, the third additional layer 108 being arranged (or formed) between the additional layers 104, 106 may substantially include aluminum or may be an aluminum layer, according to various embodiments. Further, according to various embodiments, the layers 102 being arranged between the third additional layer 108 and the additional layers 104, 106 may include a chemical compound including aluminum and titanium, as described above.

According to various embodiments, the layers 102, 104, 106, 108 shown in FIG. 1C may include at least one material of the following group of materials: titanium, aluminum, a titanium/aluminum alloy, and a titanium aluminide. According to various embodiments, the layers 102, 104, 106, 108 shown in FIG. 1C may include at least one material of the following group of materials: titanium, aluminum, copper, an aluminum/copper alloy, a titanium/aluminum alloy, and a titanium aluminide.

Figure 1D:
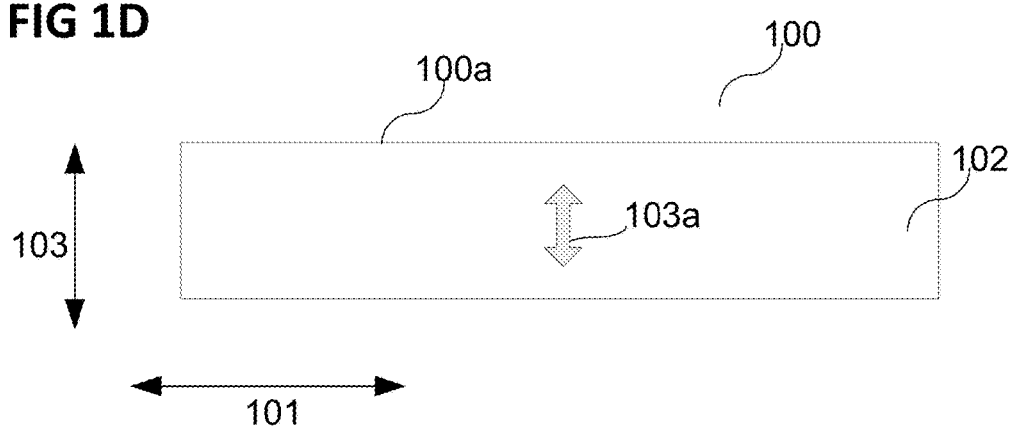

FIG. 1D shows schematically an electrode 100 in a cross sectional view, according to various embodiments, wherein the electrode 100 may include a chemical compound including titanium and aluminum, wherein the chemical composition of titanium and aluminum (the ratio of aluminum and titanium) may change along a direction, e.g. along the thickness direction 103a. In other words, the concentration of titanium and aluminum in the electrode 100 may change along the thickness direction 103a.

Figure 1E:
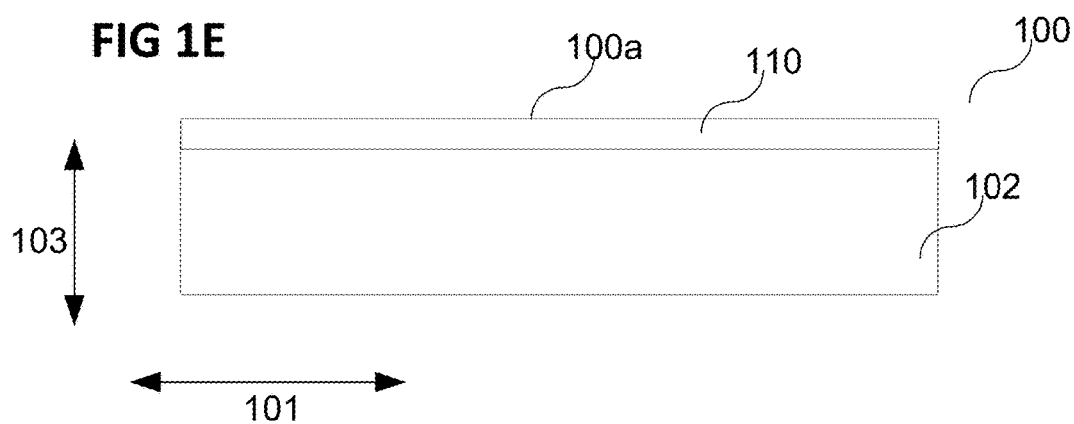

As shown in FIG. 1E, according to various embodiments, the electrode 100 may further include a titanium nitride layer 110 disposed over the at least one layer 102, wherein the at least one layer 102 may include a chemical compound including titanium and aluminum, as described above. According to various embodiments, the electrode 100 may further include a titanium nitride layer 110 disposed over the at least one layer 102, 104, 106, 108, wherein the at least one layer 102, 104, 106, 108 may include a chemical compound including titanium and aluminum, as described above. According to various embodiments, the titanium nitride layer 110 may be regarded as part of the electrode. According to another embodiment, the titanium nitride layer 110 may be an additional layer covering the electrode 100. According to various embodiments, the titanium nitride layer 110 may be disposed on top of the electrode 100 or on top of the at least one layer 102. According to various embodiments, the titanium nitride layer 110 may provide the upper surface of the electrode 100.

According to various embodiments, the titanium nitride layer 110 may be a barrier layer, e.g. the titanium nitride layer 110 may not allow a substantial diffusion and/or material transport through the titanium nitride layer 110. According to various embodiments, the titanium nitride layer 110 may be an adhesion promotion layer for depositing layers on top of the electrode 100. According to various embodiments, the titanium nitride layer 110 may be electrically conductive. Since the titanium nitride layer of the electrode 100 may enhance the absorption of light, e.g. being generally used as anti-reflective coating, the titanium nitride layer 110 may have a thickness that may allow the electrode 100 to be highly reflective, e.g. reflecting more than about 80% of the electromagnetic radiation (light) in the optical range. Therefore, according to various embodiments, the titanium nitride layer 110 may have a thickness equal to or smaller than about 30 nm, e.g. equal to or smaller than about 20 nm, e.g. equal to or smaller than about 10 nm.

According to various embodiments, the upper surface 100a of the electrode 100 may have a roughness of equal to or less than 3 nm RMS roughness. According to various embodiments, the RMS roughness of the upper surface 110 of the electrode 100 may be in the range from about 1 nm to about 3 nm, e.g. smaller than 3 nm, e.g. smaller than 2 nm, e.g. smaller than 1 nm, e.g. in the range of about 2 nm.

Figure 1F:
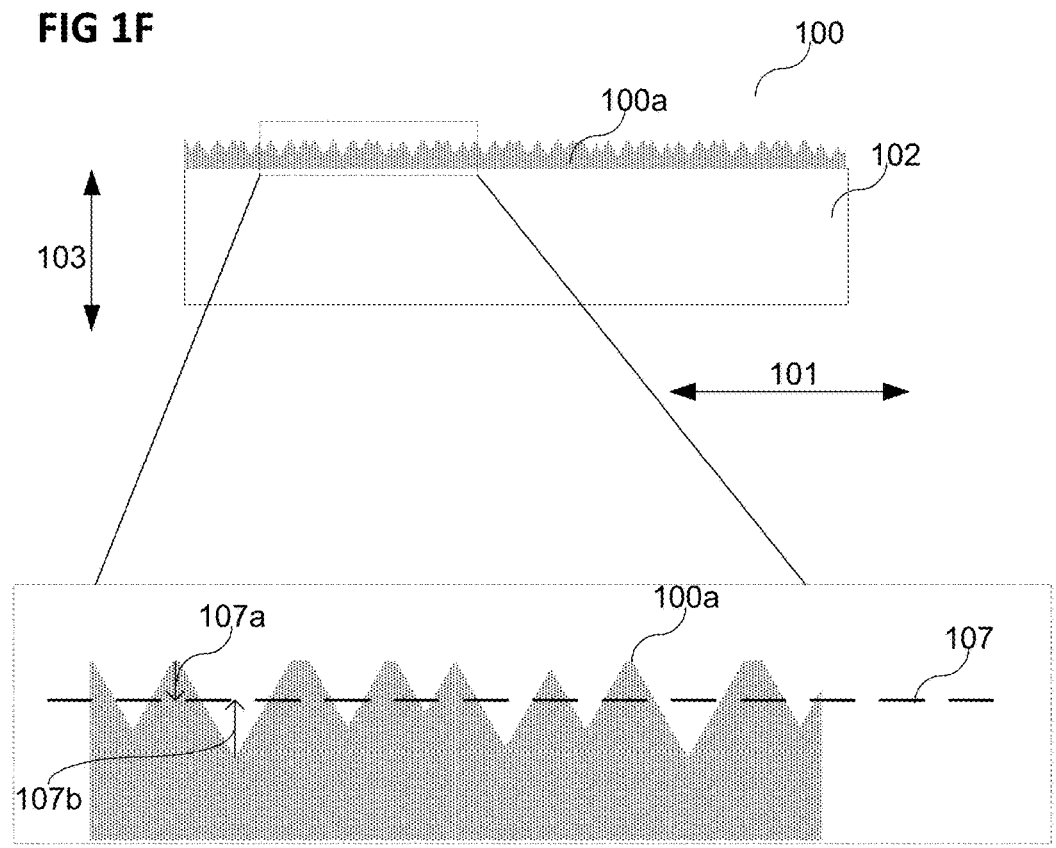
FIG. 1F shows schematically a detailed illustration of the surface roughness of the surface of an electrode, according to various embodiments.

FIG. 1F shows an electrode 100 for illustrating the surface roughness of the upper surface 100a of the electrode 100. The surface roughness may be quantified by determining the vertical deviations 107a, 107b of the surface 100a of the electrode 100 from the respective shape of the corresponding ideal surface 107. The roughness may be quantified as RMS-roughness (root-mean-squared-roughness), wherein the arithmetic value (root-mean-squared) of the vertical deviations 107a, 107b of the surface 100a of the electrode 100 from the ideal surface 107 may be used to determine and/or quantify the roughness of the surface 100a of the electrode 100. According to various embodiments, the surface roughness may be determined by using a limited number of measurements of the thickness of the electrode 100 and/or of the surface topography and a statistical analysis. According to various embodiments, the ideal surface 107 may be determined by an arithmetic analysis of the measured height of the electrode 100 and/or the measured surface topography of the electrode 100, e.g. analyzing atomic force microscope measurements.

In the following, an electronic device (an optoelectronic device) may be provided, according to various embodiments, on the basis of the electrode 100, as described above.

Current optoelectronic devices may include at least an electrode including an aluminum layer being protected by a thin titanium nitride layer. Using such a common Al/TiN-layer stack the aluminum layer may be restricted to be a thin layer (e.g. smaller than about 50 nm), which may limit the use of such an electrode. Electrodes in optoelectronic devices may for example need a high reflectance of the electrode and therefore the aluminum layer of the common electrode may be too thin, to provide a sufficient high reflectivity. Moreover, common Al/TiN-layer stacks may form so-called hillocks (protruding aluminum hills) due to film stress during manufacturing of an electronic device. Further, a common Al/TiN layer stack may have a high RMS-roughness of approximately 10 nm or larger than approximately 10 nm, which may be directly linked to a certain limited device lifetime. Especially light converting devices, such as light emitting diodes may be inefficient using such a common Al/TiN layer stack electrode.

As already described above, according to various embodiments, the electrode 100 may have a low RMS-roughness of the surface layer. According to various embodiments, the electrode 100 may provide a high reflectivity, since the thickness of the electrode 100 may not be limited to a specific value. According to various embodiments, the electrode 100 may have a thickness in the range of about 300 nm (or larger than about 300 nm), while having at the same time a low surface roughness in the range from about 1 nm to about 3 nm.

According to various embodiments, the electrode 100, as described above, may provide a smooth electrically conductive primary layer which may be used as electrode layer in electronic devices and/or optoelectronic devices, e.g. in semiconductor devices generating or converting light, e.g. in an organic light emitting diode (OLED), e.g. in OLED-displays. According to various embodiments, the electrode 100 may be a part of at least one of the following electronic devices: an integrated circuit, a photodiode, a solar cell, an organic photodiode, an organic solar cell, a phototransistor, an organic phototransistor, a photomultiplier, an organic photomultiplier, an integrated optical circuit (IOC) element, an organic integrated optical circuit (IOC) element, a photo-resistor, a charge-coupled imaging device, an organic photo-resistor, an organic charge-coupled imaging device, a laser diode, an organic laser diode, a laser, a light emitting diode (LED), an organic LED (OLED), a top-emitting OLED, a bottom-emitting OLED, an active matrix organic light emitting diode (AMOLED).

Figure 2A:
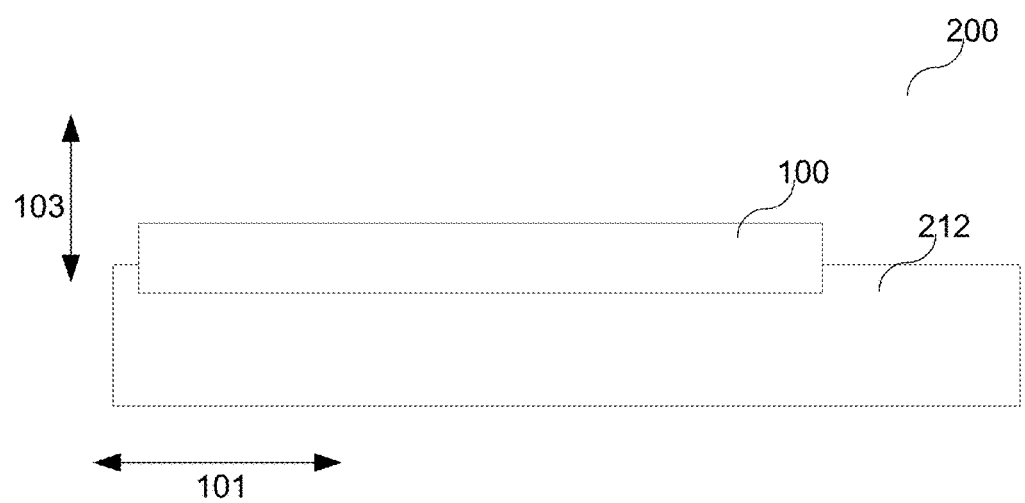
FIGS. 2A and 2B show respectively an electronic device including an electronic circuit and an electrode, according to various embodiments.

FIG. 2A shows schematically an electronic device 200 in a cross sectional view, according to various embodiments, the electronic device 200 including: an electronic circuit 212; and an electrode 100 including at least one layer including a chemical compound including aluminum and titanium, wherein the electrode 100 is electrically coupled with the electronic circuit 212.

According to various embodiments, the electronic device 200 may include at least one electronic component of the following group of electronic components: an integrated circuit, a photodiode, a solar cell, an organic photodiode, an organic solar cell, a phototransistor, an organic phototransistor, a photomultiplier, an organic photomultiplier, an integrated optical circuit (IOC) element, an organic integrated optical circuit (IOC) element, a photo-resistor, a charge-coupled imaging device, an organic photo-resistor, an organic charge-coupled imaging device, a laser diode, an organic laser diode, a laser, a light emitting diode (LED), an organic light emitting diode (OLED), a top-emitting organic light emitting diode, a bottom-emitting organic light emitting diode, an active matrix organic light emitting diode (AMOLED).

According to various embodiments, the electrode 100 included in the electronic device 200 may have the same properties, features and functionalities as described above, e.g. referring to FIG. 1A to FIG. 1F.

According to various embodiments, the electronic circuit 212 may include at least on component of the following group of components: a resistor, a transistor (a field-effect transistor), a capacitor, an inductor, a diode, a wiring or conductive path, a carrier or a substrate. According to various embodiments, the electronic circuit 212 may include at least one of the following: an integrated circuit structure, a chip, a die, a microprocessor, a microcontroller, a memory structure, a logic circuit, a sensor, a nano-sensor, an integrated transceiver, a micro-mechanical system, a microelectronic device, a nano-electronic device, an electrical circuit, a digital circuit, an analog circuit, and any other electronic device based on semiconductor technology.

According to various embodiments, the electronic circuit 212 may include a complementary metal oxide semiconductor circuit. According to various embodiments, the electronic circuit 212 may include an electronic circuitry provided in complementary metal oxide semiconductor technology. According to various embodiments, the electronic circuit 212 may be (or at least a part of) at least one of a microprocessor, a microcontroller, and a digital logic circuit e.g. provided in CMOS technology.

According to various embodiments, the electronic circuit 212 may include at least one of the following basic semiconductor technologies: MOS-technology (metal oxide semiconductor technology), nMOS-technology (n-channel MOS-technology), pMOS-technology (p-channel MOS-technology), CMOS-technology (complementary metal oxide semiconductor technology). According to various embodiments, the electronic circuit 212 may include a field effect transistor (FET) (e.g. a metal oxide semiconductor field effect transistor (MOSFET), a fin field effect transistor (FinFET), and/or a floating gate transistor.

According to various embodiments, the electronic circuit 212 may include at least one metallization layer, to provide the wiring for the electronic circuit 212 and to provide an electrical connection between the electronic circuit 212 and the electrode 100. According to various embodiments, the at least one metallization layer may include for example a patterned dielectric layer, e.g. including an electrically insulating material, e.g. a low-k material, and a wiring including an electrically conductive material, e.g. aluminum and/or copper. According to various embodiments, the at least one metallization layer may be formed using aluminum technology and/or copper technology.

Figure 2B:
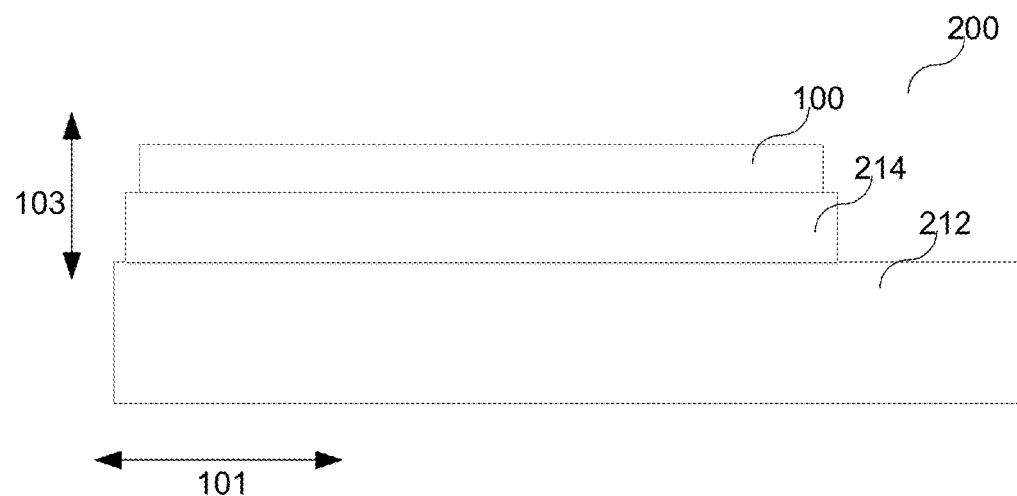

According to various embodiments, the electronic circuit 212 may be electrically conductively coupled to the at least one electrode 100 via a metallization structure 214, as illustrated in FIG. 2B. According to various embodiments, the metallization structure 214 may be disposed between the electronic circuit 212 and the electrode 100. According to various embodiments, the metallization structure 214 may include one or more metallization layers. According to various embodiments, the metallization structure 214 may include at least one of a dielectric structure and an electrically conductive wiring structure. The metallization structure 214 may further include vias. The metallization structure 214 may further include landing pads.

According to various embodiments, the metallization structure 214 may include at least one electrically conductive material (e.g. electrically conductive portions), e.g. a metal (aluminum, copper, cobalt, tungsten, titanium, tantalum, vanadium). According to various embodiments, the metallization structure 214 may further include at least one dielectric material (e.g. dielectric portions), e.g. at least one low-k dielectric, e.g. at least one of the following group of dielectric materials: silicon dioxide, (fluorine or carbon) doped silicon dioxide, porous silicon dioxide, porous (fluorine or carbon) doped silicon dioxide, polymers, organic polymeric dielectrics, polyimide, polynorbornenes, benzocyclobutene, polytetrafluoroethylene, and silicone based polymeric dielectrics (e.g. hydrogen silsesquioxane or methylsilsesquioxane).

According to various embodiments, the metallization layer 214 may include at least one patterned dielectric layer, e.g. a low-k dielectric layer, and electrical connections realizing the functionality of the underlying electrical circuit 212, wherein the metallization structure 214 may further provide the wiring to electrically connect the electrode 100 with the electronic circuit 212. According to various embodiments, a plurality of electrodes 100 may be disposed at least one of over and in the electronic circuit 212, wherein the metallization structure 214 may electrically connect the plurality of electrodes 100 with the electronic circuit 212. According to various embodiments, the plurality of electrodes 100 may be controlled via the electronic circuit 212. According to various embodiments, the plurality of electrodes 100 may be individually addressed via the electronic circuit 212. According to various embodiments, the electronic circuit 212 may provide the power supply for the electrode 100 or for the plurality of electrodes 100 being disposed over the electronic circuit 212.

Figure 2C:
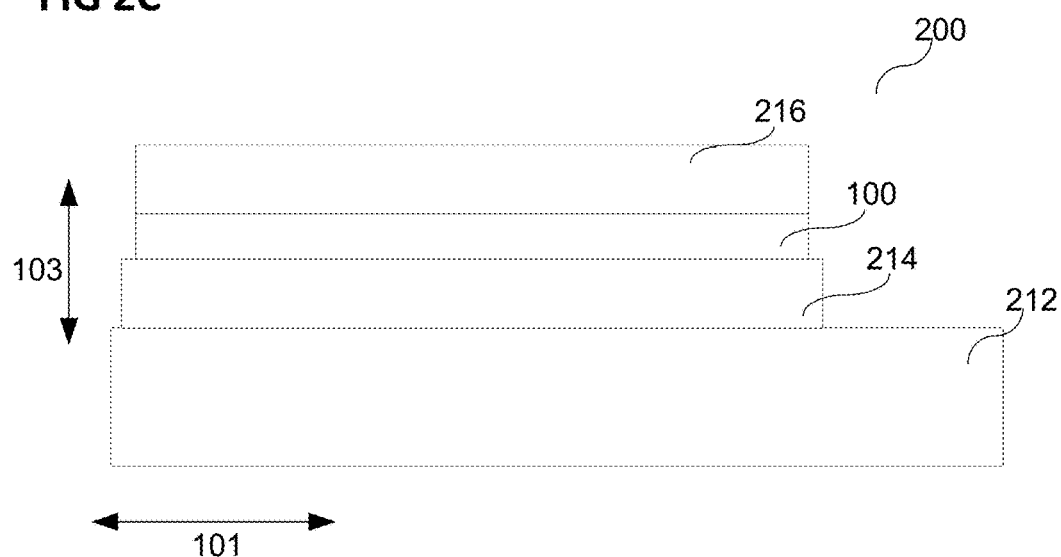
FIG. 2C shows an electronic device including an electronic circuit, an electrode and an electronic structure, according to various embodiments.

FIG. 2C shows a schematic cross sectional view of an electronic device 200 including an electronic circuit 212, a metallization structure 214 dispose over the electronic circuit 212, an electrode 100 disposed over the metallization structure 214, and an optoelectronic structure 216 disposed over the electrode 100, wherein the optoelectronic structure 216 may be electrically conductively coupled to the electrode 100. According to various embodiments, since the electrode 100 may be electrically conductively coupled to the electronic circuit 212, the optoelectronic structure 216 may be electrically conductively coupled to the electronic circuit 212 via the electrode 100 and the metallization structure 214. Therefore, the optoelectronic structure 216 may be for example controlled via the electronic circuit 212.

According to various embodiments, the electronic device 200 may include a plurality of optoelectronic structures 216 being dispose over a plurality of electrodes 100. According to various embodiments, plurality of optoelectronic structures 216 may be individually addressed via the electronic circuit 212, e.g. via the plurality of electrodes 100 being disposed over the electronic circuit 212. According to various embodiments, the electronic circuit 212 may provide the power supply for the electrode 100 or for the plurality of electrodes 100 being disposed over the electronic circuit 212 and therefore, the electronic circuit 212 may provide the power supply for the optoelectronic structure 216 or the plurality of optoelectronic structures 216.

According to various embodiments, the optoelectronic structure 216 may be configured as an optoelectronic device selected from a group of optoelectronic devices consisting of: a light emitting device; a photovoltaic cell; and an optoelectronic sensor. According to various embodiments, the electrode 100 may be a bottom electrode (e.g. a first electrode) for a light emitting device; a photovoltaic cell; and/or an optoelectronic sensor.

According to various embodiments, the optoelectronic structure 216 may include at least one light emitting diode. According to various embodiments, the optoelectronic structure 216 may include a plurality of light emitting diodes. According to various embodiments, the optoelectronic structure 216 may include at least one inorganic semiconductor material being configured as an electroluminescence layer. According to various embodiments, the electrode 100 may provide a first electrode 100 for the at least one light emitting diode. According to various embodiments, each electrode 100 of the plurality of electrodes included in the electronic device 200 may be an electrode for a respective light emitting diode.

According to various embodiments, the electronic device 200 may be an LED array including a plurality of light emitting diodes being controlled by the electronic circuit 212. According to various embodiments, the at least one light emitting diode may be a green emitting LED, a red emitting LED, a blue emitting LED, an orange emitting LED, a yellow emitting LED, a violet emitting LED, or an LED emitting any other possible color. According to various embodiments, the at least one light emitting diode may be a phosphor converted LED, e.g. a phosphor converted blue LED or ultra violet LED (UV-LED). According to various embodiments, the at least one light emitting diode may include at least one material of the following group of materials providing the electroluminescence material: Gallium (III) phosphide (GaP), Aluminum gallium indium phosphide (AlGaInP), Aluminum gallium phosphide (AlGaP), Indium gallium nitride (InGaN), Gallium (III) nitride (GaN), Gallium arsenide (GaAs), Aluminum gallium arsenide (AlGaAs).

According to various embodiments, the at least one light emitting diode may include a second electrode, e.g. the electrode 100 may be a bottom electrode 100 and a second electrode may provide the top electrode. According to various embodiments, the second electrode may be transparent for the light emitted from the electroluminescence layer (or at least partially transparent to the specific wavelengths being emitted from the electroluminescence layer), wherein the electroluminescence layer may be arranged between the bottom electrode 100 and the transparent top electrode.

According to various embodiments, a transparent electrode may include a transparent electrically conductive oxide (TCO), e.g. tin-doped indium oxide (ITO), e.g. aluminum-doped zinc oxide (AZO), e.g. indium-doped cadmium oxide (ICO). According to various embodiments, the transparent top electrode (e.g. a TCO layer) may be formed (e.g. deposited) using a chemical vapor deposition (CVD) process or a physical vapor deposition (PVD) process, e.g. metal organic chemical vapor deposition (MOCVD), metal organic molecular beam deposition (MOMBD), atomic layer deposition, molecular beam epitaxy (MBE), an atomic layer CVD process (ALCVD), spray pyrolysis, pulsed laser deposition (PLD), sputtering, magnetron sputtering, DC-sputtering, AC-sputtering.

According to various embodiments, the at least one light emitting diode may be configured as an organic light emitting diode. In this case, the electroluminescence layer, which may generate light, may include an organic material, e.g. a polymer or small organic molecules. Further, the at least one organic light emitting diode may further include functional layers or a layer stack, e.g. charge carrier injection layers for electron and hole injection, charge transport layers for electron and hole transport, barrier layers configured as electron blocking layer or hole blocking layer, and other transfer layers, e.g. to adapt the electronic properties of the layers and the material, e.g. to change work functions and band structures.

According to various embodiments, the organic light emitting diode may include at least a first and a second electrode, wherein the electroluminescence layer may be arranged between the first and the second electrode. According to various embodiments, one of the electrodes included in the organic light emitting diode may be transparent to the emitted light, wherein the other electrode of the electrodes may be configured to be highly reflective (to be a mirror). Therefore, a first electrode may be configured, as described herein referring to the electrode 100, to reflect the emitted light of the electroluminescence layer. A second electrode may include for example a transparent electrically conductive oxide (TCO), such that light may be emitted from the electroluminescence layer to the environment. Depending on the arrangement of the mirror electrode 100 and the second transparent electrode, the organic light emitting diode may be a bottom-emitting organic light emitting diode or a top-emitting organic light emitting diode.

According to various embodiments, an electronic device 200 may include a plurality of organic light emitting diodes, e.g. arranged in a regular array, wherein the organic light emitting diode arrangement may be controlled via the underlying electronic circuit 212, as described above. In other words, the electronic device 200 may be configured as an organic light emitting diode display device.

According to various embodiments, the electronic device 200 may include a plurality of organic light emitting diodes having various colors, e.g. depending on the configuration of the electroluminescence layer, e.g. the used polymers or molecules. According to various embodiments, the electronic device 200 may include a plurality of organic light emitting diodes having various colors providing white light, e.g. used as an OLED back-light for a display device. According to various embodiments, the plurality of organic light emitting diodes may have substantially the same color, wherein the electronic device 200 may in this case further include a color filter layer, e.g. to provide the desired different colors. According to various embodiments, a color filter layer may include at least one phosphorescent or fluorescent material.

According to various embodiments, the electronic circuit 212 and the electrode 100 may provide the basis for an electronic structure being formed over the electrode 100, wherein the electronic structure and the electrode 100 may for example provide a light emitting electronic device. In this case, the electrode 100 may function as a mirror layer and an electrode for the light emitting electronic device. Using the electrode 100, as described above, may enhance the efficiency of an light emitting electronic device, since the physical properties of the electrode 100, as described above, may be beneficial for being used as an electrode in an light emitting electronic device.

Figure 9B:
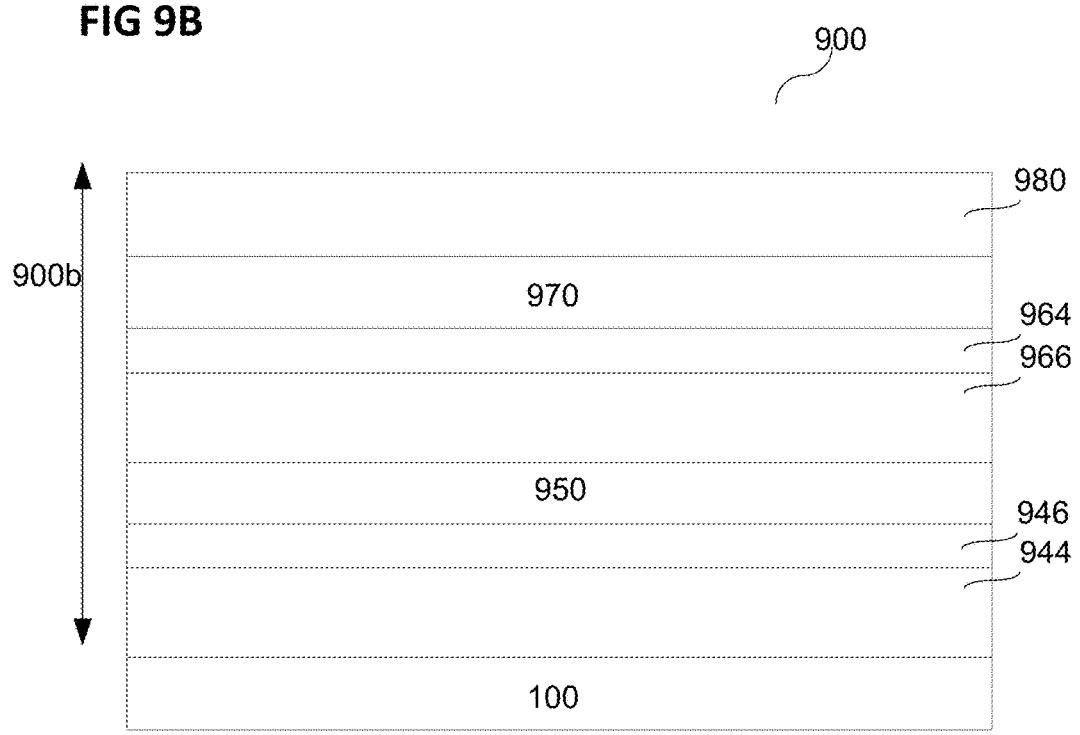
Figure 10A:
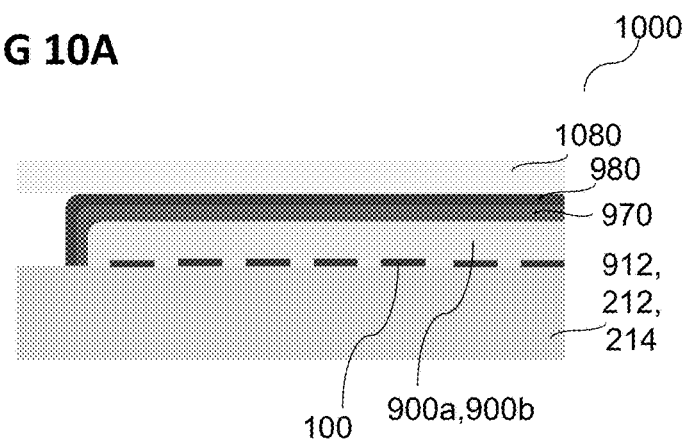
FIGS. 10A and 10B show respectively a schematic a cross sectional view of an electronic device, according to various embodiments.
Figure 10B:
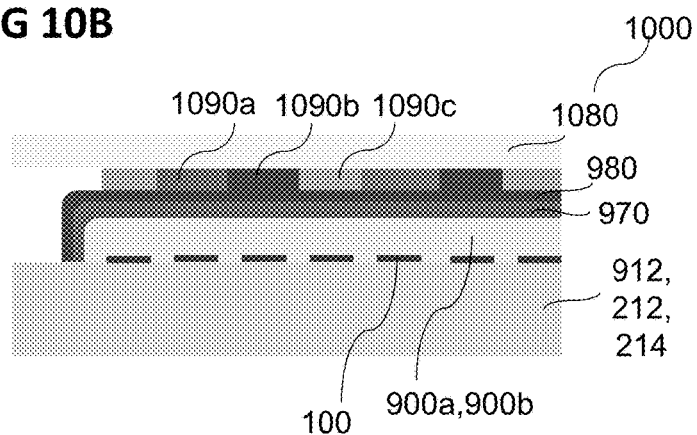
Figure 10C:
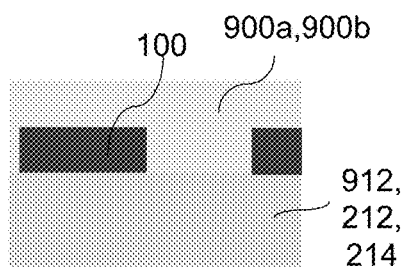
FIGS. 10C and 10D show respectively a detailed cross sectional view of an electrode in an electronic device, according to various embodiments.
Figure 10D:
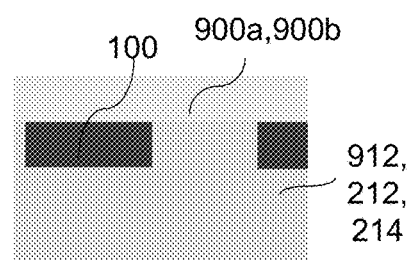
Figure 10E:
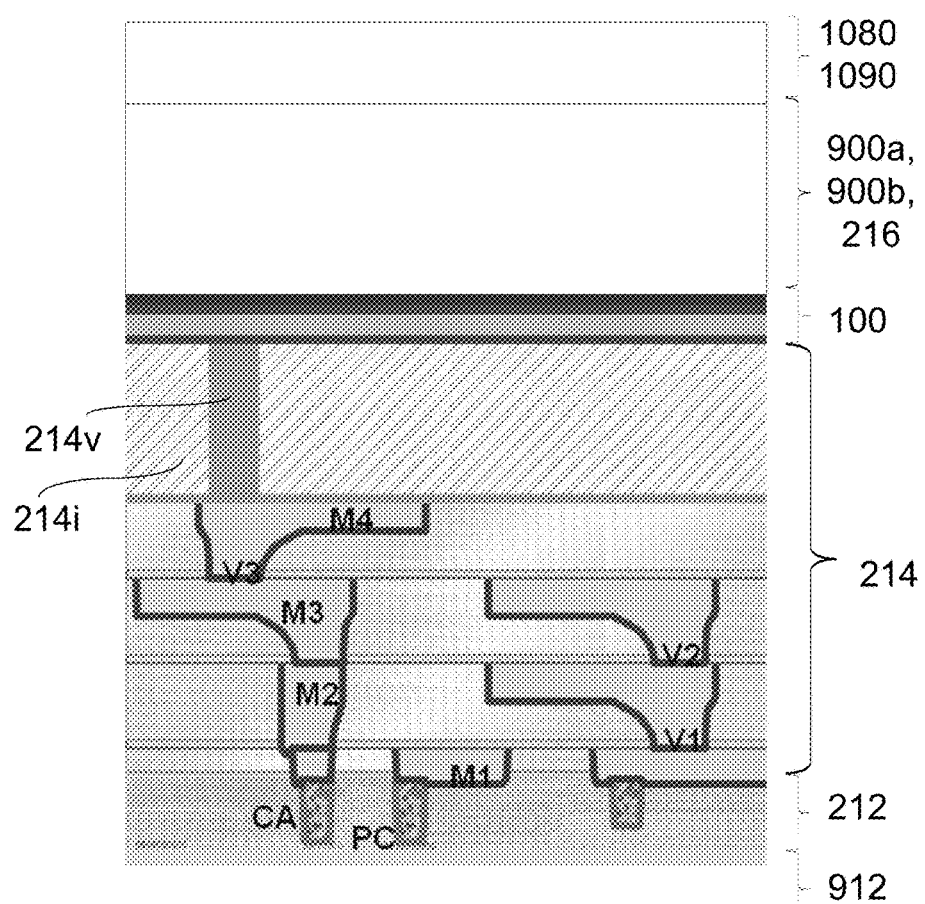
FIG. 10E shows an electronic device including an electronic circuit, a metallization structure, an electrode and an optoelectronic structure, according to various embodiments.

Further, according to various embodiments, providing a smooth primary layer or a smooth electrode layer (e.g. electrode 100 as already described) may enable the precise control of the layer thicknesses of the functional layers of the light emitting structure deposited on top of the smooth electrode layer (c.f. for example FIG. 9A and FIG. 10E). In this case, it may not be necessary to take thickness variations of the electrode into account which may allow for example reducing the layer thickness of a functional layer on top of the electrode 100. According to various embodiments, a smooth electrode layer may further allow depositing layers having a larger thickness on top of the electrode layer having a sufficient high quality (roughness and microstructure). Therefore, the efficiency of a light emitting electronic device (e.g. OLED) may be enhanced, since each of the functional layers in the OLED layer stack may be formed with the optimal thickness as desired. In other words, a reduced surface layer roughness of the electrode 100 may reduce the necessary layer thickness of one or more layers being deposited on top of the electrode 100 and/or may increase the quality of the grown layers, e.g. since for example the hillock formation may be prevented. Further, the electrode 100 may be temperature stable, as already described.

According to various embodiments, the electrode 100, as described herein, may be a part of an electrode structure for a light emitting structure deposited on top of the electrode 100. According to various embodiments, the light emitting structure deposited on top of the electrode 100 may include one or more additional electrode layers, e.g. influencing the reflectivity and the electronic properties, e.g. work functions, of the light emitting structure. According to various embodiments, the electronic circuit 212 may be an electronic circuit 212 being formed at least one of over an in a semiconductor substrate. According to various embodiments, the electrode 100, as described herein, may be an annealed electrode layer stack.

FIG. 3 shows a schematic flow diagram of a method for manufacturing an electronic or optoelectronic device, according to various embodiments. According to various embodiments, an optoelectronic device may include a light emitting device, as described above. According to various embodiments, a method for manufacturing an electronic or optoelectronic device may include: in 310, forming an electrode layer stack, the electrode layer stack may include at least a titanium layer and an aluminum layer; in 320, annealing the electrode layer stack such that a chemical compound is formed from the aluminum of the aluminum layer and the titanium of the titanium layer; and, in 330, forming an optoelectronic structure over the electrode layer stack, wherein the optoelectronic structure is electrically conductively coupled to the annealed electrode layer stack.

According to various embodiments, forming an electrode layer stack may include a layering process. According to various embodiments, forming an electrode layer stack may further include at least one process of the following group of processes: a patterning process, polishing, a heat treatment, an etch process, a lithographic process, or another process of semiconductor industry being used for forming a layer or a structured layer at least one of over and in a carrier. According to various embodiments, forming an electrode layer stack may include forming an electrode layer stack at least one of over and in a carrier, wherein the carrier may be a semiconductor substrate or an electronic circuit (or a semiconductor substrate including an electronic circuit), as described above.

According to various embodiments, forming an electrode layer stack (or a layering process as described herein) may further include a chemical vapor deposition process (CVD). According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like.

According to various embodiments, forming an electrode layer stack (or a layering process as described herein) may further include a physical vapor deposition process (PVD), e.g. sputtering, electron beam evaporation, thermal evaporation, laser deposition, molecular beam epitaxy (MBE). According to various embodiments, physical vapor deposition may include a variety of modifications, as for example magnetron sputtering, AC magnetron sputtering, DC magnetron sputtering, ion-beam sputtering (IBS), reactive sputtering, high-power impulse magnetron sputtering (HIPIMS), vacuum evaporation, and the like.

Further, according to various embodiments, a process which may be applied to generate a thin layer of a metal, e.g. titanium and/or aluminum may be plating, e.g. electroplating or electroless plating.

According to various embodiments, annealing the electrode layer stack may include a heat treatment. According to various embodiments, the heat treatment (annealing) of the electrode layer stack on a carrier (a wafer, a substrate, and the like) may be performed with a direct contact, e.g. using a hot plate, or by radiation, e.g. using a laser or a lamp. According to various embodiments, annealing the electrode layer stack may include a rapid thermal processing (RTP), which may be performed under vacuum conditions using a laser heater or lamp heater, wherein electrode layer stack may be heated up to several hundred degree Celsius, e.g. up to about 400° C. or even greater within a short time period, e.g. within several seconds (e.g. about 1 s to about 10 s). According to various embodiments, the annealing may be performed for a duration in the range from about several minutes up about to several hours, e.g. in the range from about 1 minute to about 2 hours, e.g. in the range from about 5 minutes to about 1 hour, e.g. in the range from about 30 minutes to about 1 hour. According to various embodiments, the temperature of the electrode layer stack during the annealing duration may be in the range from about 100° C. to about 600° C., e.g. in the range from about 200° C. to about 500° C., e.g. in range from about 350° C. to about 450° C. According to various embodiments, a longer annealing duration may lead to a larger amount of titanium aluminide formed in the electrode layer stack.

According to various embodiments, forming an optoelectronic structure over the electrode layer stack may include forming an electronic device 200 or an optoelectronic structure 216, as described before. According to various embodiments, forming an optoelectronic structure over the electrode layer stack may include forming a light emitting device or a light emitting structure over the annealed electrode layer stack. According to various embodiments, forming an optoelectronic structure over the electrode layer stack may include forming an LED or an OLED, as described herein.

According to various embodiments, the optoelectronic structure may be formed over the annealed electrode layer stack. In other words, process 330 may be performed after processes 310 and 320 have been carried out, according to various embodiments.

According to various embodiments, the process 300 as described referring to FIG. 3 may be adapted, modified and/or extended in such a way, that a device 200 and/or an electrode 100 may be formed, as described before referring to FIGS. 1A to 1F and FIGS. 2A to 2C (or the later shown FIGS. 9A and 9B and FIGS. 10A to 10E).

Figure 4A:
FIG. 4A shows schematically a cross sectional view of an electrode layer stack before an annealing step has been carried out, according to various embodiments.

As shown in FIG. 4A, according to various embodiments, an electrode layer stack 400a may be formed in process 310 including a first layer 424 and a second layer 426 being disposed over the first layer 424. According to various embodiments, the first layer 424 and the second layer 426 may be in a direct physical contact to each other. In other words, the second layer 426 may be deposited on top of the first layer 424.

According to various embodiments, one of the layers 424, 426 may include titanium or may be a titanium layer, wherein the other layer of the layers 424, 426 may include aluminum or may be an aluminum layer. According to various embodiments, the first layer 424 may be a titanium layer 424 and the second layer 426 may be an aluminum layer 426.

According to various embodiments, the titanium layer 424 may have a thickness (or may be formed having a thickness) in the range from about 2 nm to about 20 nm, e.g. in the range from about 5 nm to about 20 nm, e.g. in the range from about 5 nm to about 10 nm. According to various embodiments, the aluminum layer 426 may have a thickness (or may be formed having a thickness) in the range from about 10 nm to about 400 nm, e.g. in the range from about 30 nm to about 50 nm, e.g. in the range from about 50 nm to about 150 nm.

Figure 4B:
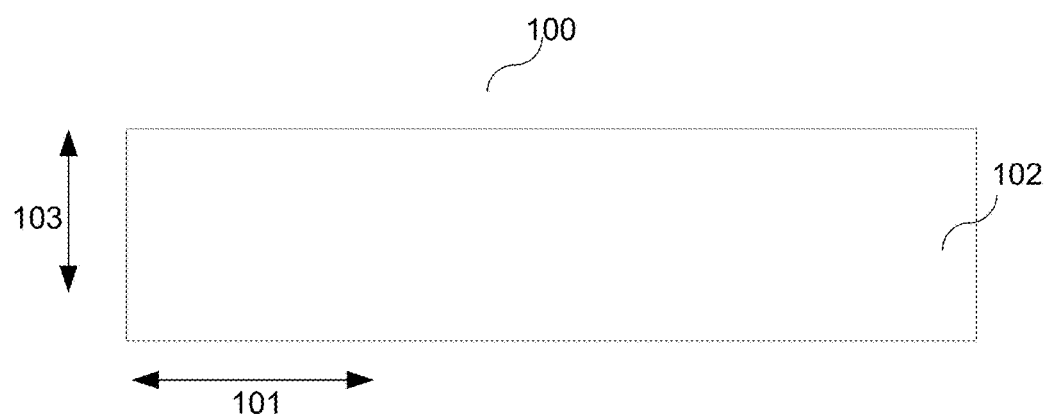
FIG. 4B shows schematically a cross sectional view of an electrode layer stack after an annealing step has been carried out, according to various embodiments.

According to various embodiments, the electrode layer stack 400a may be annealed during process 320 such that an electrode 100 may be formed as described above, e.g. referring to FIGS. 1A to 1E. FIG. 4B shows a schematic cross sectional view of the annealed electrode layer stack 400a forming the electrode 100. In other words, applying processes 310 and 320 may allow forming an electrode 100, as described before.

Figure 5A:
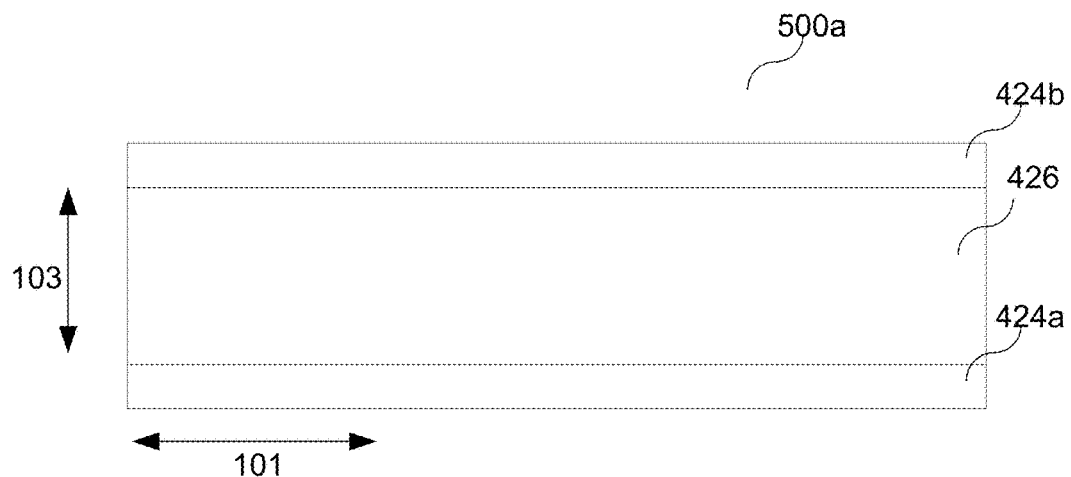
FIG. 5A shows schematically a cross sectional view of an electrode layer stack before an annealing step has been carried out, according to various embodiments.

According to various embodiments, process 310 of forming the electrode layer stack may include forming a first titanium layer; forming an aluminum layer over the first titanium layer; and forming a second titanium layer over the aluminum layer. As shown in FIG. 5A, according to various embodiments, an electrode layer stack 500a may be formed in process 310 including a first layer 424a, a second layer 426 being disposed over the first layer 424a, and a third layer 424b being disposed over the second layer 426. According to various embodiments, the first layer 424a and the second layer 426 may be in a direct physical contact to each other; and the second layer 426 and the third layer 424b may be in a direct physical contact to each other.

According to various embodiments, at least one of the layers 424a, 426, 424b may include titanium or may be a titanium layer, wherein another layer of the layers 424a, 426, 424b may include aluminum or may be an aluminum layer. According to various embodiments, the first layer 424a and the third layer may be titanium layers 424a, 424b and the second layer 426 may be an aluminum layer 426.

According to various embodiments, the titanium layers 424a, 424b may have a thickness (or may be formed having a thickness) in the range from about 1 nm to about 20 nm, e.g. in the range from about 2 nm to about 10 nm, e.g. in the range from about 5 nm to about 20 nm, e.g. in the range from about 5 nm to about 10 nm, e.g. in the range from about 4 nm to about 6 nm. According to various embodiments, the aluminum layer 426 may have a thickness (or may be formed having a thickness) in the range from about 10 nm to about 400 nm, e.g. in the range from about 20 nm to about 400 nm, e.g. in the range from about 50 nm to about 300 nm, e.g. in the range from about 50 nm to about 150 nm, e.g. in the range from about 30 nm to about 50 nm.

According to various embodiments, the first layer 424a and the third layer 424b may have the same thickness. According to various embodiments, the first layer 424a and the third layer 424b may have different thicknesses.

Figure 5B:
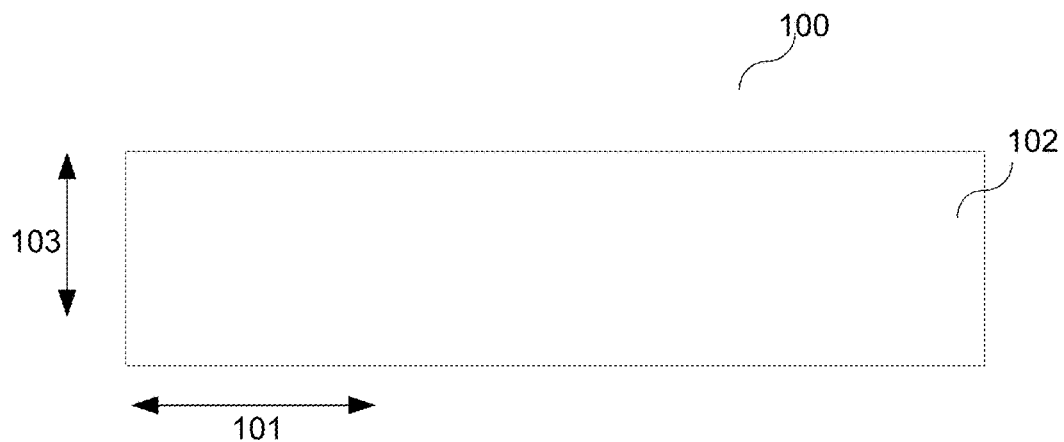
FIG. 5B shows schematically a cross sectional view of an electrode layer stack after an annealing step has been carried out, according to various embodiments.

According to various embodiments, the electrode layer stack 500a may be annealed during process 320 such that an electrode 100 may be formed as described above. FIG. 5B shows a schematic cross sectional view of the annealed electrode layer stack 500a forming the electrode 100. In other words, applying processes 310 and 320 as schematically shown in FIG. 5A and FIG. 5B may allow forming an electrode 100, as described before.

Figure 6A:
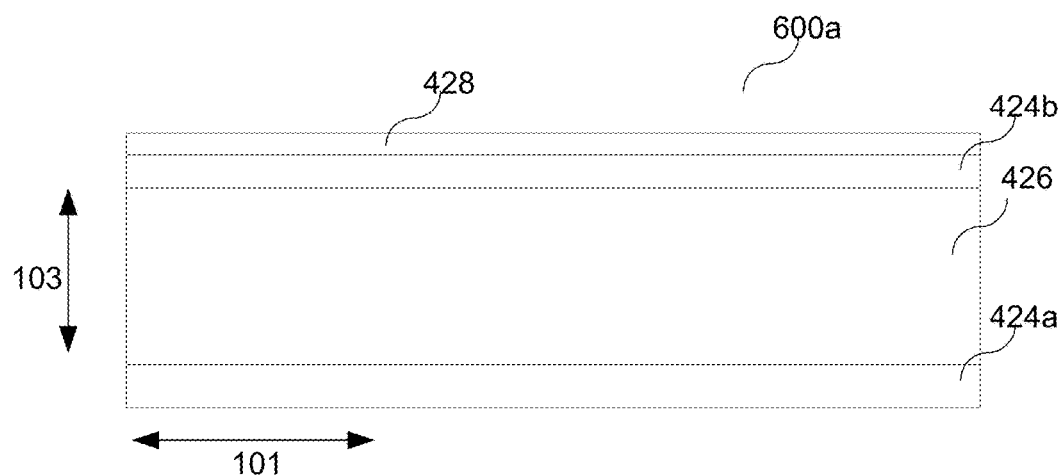
FIG. 6A shows schematically a cross sectional view of an electrode layer stack before an annealing step has been carried out, according to various embodiments.

According to various embodiments, forming an electrode layer stack may further include forming a titanium nitride layer over the second titanium layer. FIG. 6A shows an electrode layer stack 600a in analogy to the electrode layer stack 500a shown and described referring to FIGS. 5A and 5B, including additionally a fourth layer 428. According to various embodiments, the fourth layer 428 may be a titanium nitride layer or a layer stack 428 including at least one titanium nitride layer. According to various embodiments, the fourth layer 428 may be a tantalum layer or a layer stack 428 including at least one tantalum layer.

Figure 6B:
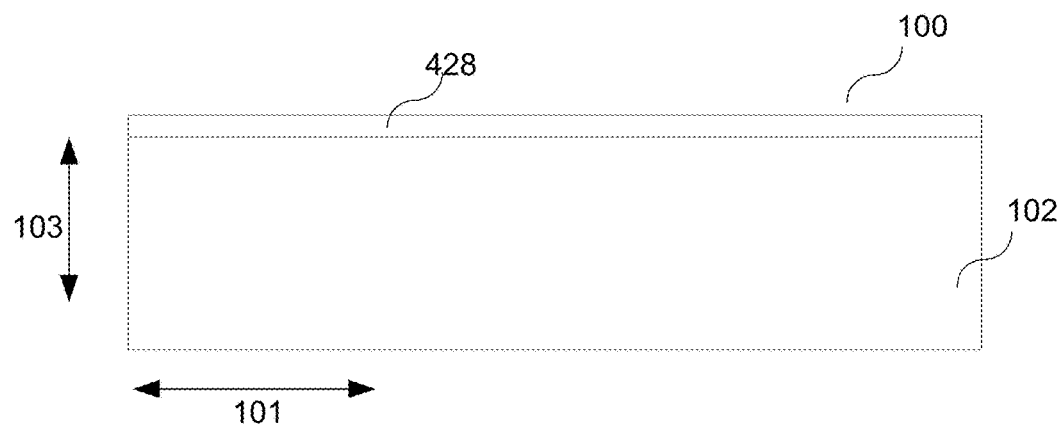
FIG. 6B shows schematically a cross sectional view of an electrode layer stack after an annealing step has been carried out, according to various embodiments.

As shown in FIG. 6B, the titanium nitride layer 428 or the layer stack 428 including at least one titanium nitride layer may be on top of the electrode 100 or may be the top layer of the electrode 100 after an annealing of the electrode layer stack 600a has been carried out, e.g. in process 320. According to various embodiments, the annealed electrode layer stack 600a may provide the electrode 100, as already described herein. In other words, applying processes 310 and 320 as schematically shown in FIG. 6A and FIG. 6B may allow forming an electrode 100, as described herein.

Figure 7A:
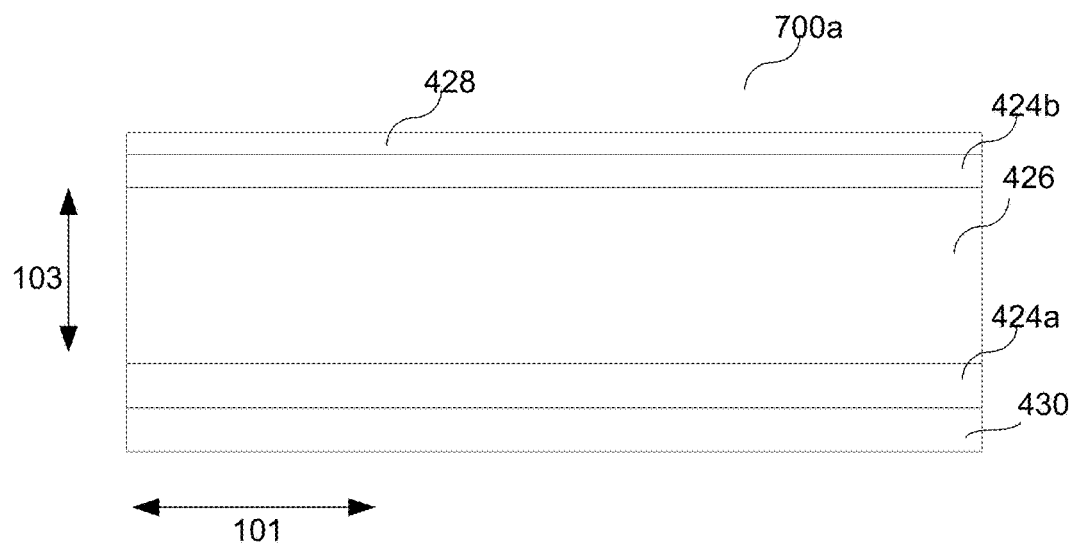
FIG. 7A shows schematically a cross sectional view of an electrode layer stack before an annealing step has been carried out, according to various embodiments.

According to various embodiments, forming an electrode layer stack may further include forming an additional titanium nitride layer. FIG. 7A shows a modification of the electrode layer stacks 500a, 600a, as already described, according to various embodiments. According to various embodiments, the electrode layer stack 700a illustrated in FIG. 7A may further include a fifth layer 430. According to various embodiments, the fifth layer 430 may be deposited at first providing the bottom layer of the electrode layer stack 700a. According to various embodiments, the fifth layer 430 may include tantalum or may be a tantalum layer. According to various embodiments, the fifth layer 430 may be configured as a barrier layer to prevent diffusion of material into the electrode layer stack 700a. According to various embodiments, the fifth layer 430 may be configured as a barrier layer to prevent diffusion of copper and/or aluminum into the electrode layer stack 700a during the annealing process. According to various embodiments, the fifth layer 430, e.g. the tantalum layer 430, may have a thickness in the range from about 1 nm to about 50 nm, e.g. in the range from about 5 nm to about 50 nm, e.g. in the range from about 10 nm to about 30 nm.

According to various embodiments, the fifth layer 430, e.g. the tantalum layer 430, may prevent diffusion of a material from the metallization structure 214 of an underlying electronic circuit 212 into the electrode layer stack or into the electrode 100. According to various embodiments, the tantalum layer 430, may prevent diffusion of copper from the metallization of an underlying electronic circuit 212 into the electrode layer stack or into the electrode 100, e.g. during process 320 is carried out.

According to various embodiments, the electrode layer stack 700a illustrated in FIG. 7A may include a top cover layer, e.g. a titanium nitride layer 428, as already described. According to another embodiment, the layer 428 may be a tantalum top layer 428 or may include at least one of tantalum, a tantalum alloy, and a tantalum compound. Further, according to various embodiments, the layer 428 may be a layer stack including at least one tantalum layer. Further, according to various embodiments, the layer 428 may be a layer stack including at least one tantalum layer and at least one titanium nitride layer. Further, according to various embodiments, the layer 428 may be a layer stack including at least one tantalum layer and at least one titanium layer.

Further, according to various embodiments, the layer 430 may be a layer stack including at least one tantalum layer or at least one titanium nitride layer. Further, according to various embodiments, the layer 430 may be a layer stack including at least one tantalum layer and at least one titanium nitride layer. Further, according to various embodiments, the layer 430 may be a layer stack including at least one tantalum layer and at least one titanium layer.

According to various embodiments, the top layer 428 and the bottom layer 430 may not be substantially influenced by an annealing process. Therefore, as exemplarily shown in FIG. 7B, the annealed layer stack 700a may form the electrode 100, as described before. In other words, applying processes 310 and 320 as schematically shown in FIG. 7A and FIG. 7B may allow forming an electrode 100, as described before.

Figure 7B:
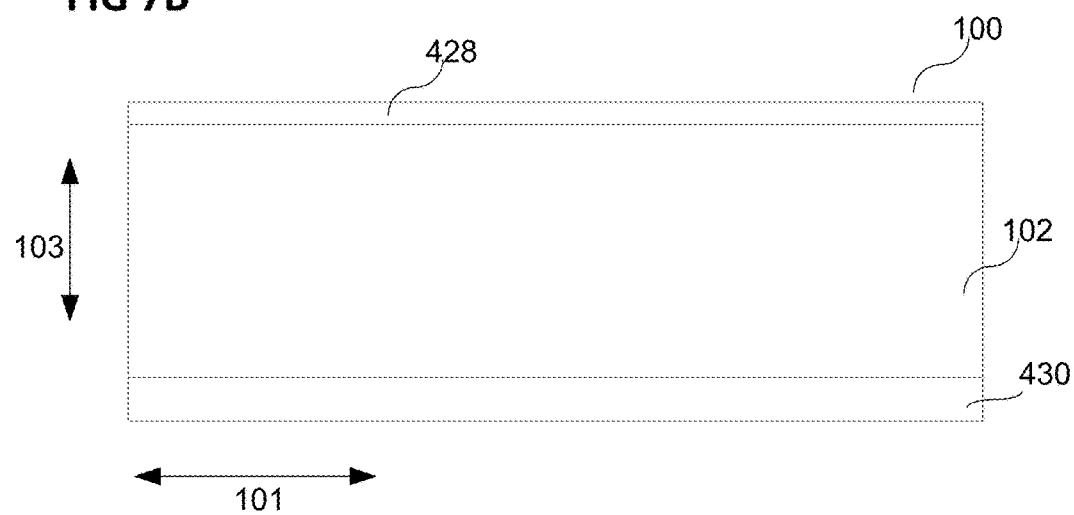
FIG. 7B shows schematically a cross sectional view of an electrode layer stack after an annealing step has been carried out, according to various embodiments.

According to various embodiments, the annealed layer stack 700a, as shown in FIG. 7B, may include at least one layer 102 including a chemical compound based one aluminum and titanium, e.g. titanium aluminide. Further the annealed layer stack 700a may include a top layer 428 including a titanium nitride or a tantalum. Further, according to various embodiments, the annealed layer stack 700a may include a top layer stack 428 including at least one tantalum layer or at least one layer including tantalum. Further, according to various embodiments, the annealed layer stack 700a may include a top layer stack 428 including at least one titanium nitride layer and at least one tantalum layer. According to various embodiments, the top layer stack 428 or the top layer 428 may have a thickness in the range from about 5 nm to about 20 nm.

According to various embodiments, the annealed layer stack 700a, as shown in FIG. 7B, may include a bottom layer 430 including a titanium nitride or a tantalum. Further, according to various embodiments, the annealed layer stack 700a may include a bottom layer stack 430 including at least one tantalum layer or at least one layer including tantalum. Further, according to various embodiments, the annealed layer stack 700a may include a bottom layer stack 430 including at least one titanium nitride layer and at least one tantalum layer. According to various embodiments, the bottom layer stack 430 or the bottom layer 430 may have a thickness in the range from about 5 nm to about 50 nm, e.g. in the range from about 5 nm to about 20 nm.

According to various embodiments, there may be other possibilities for forming layer stacks, such as layer stack 400a, 500a, 600a, 700a, such that the annealed layer stack may form the electrode 100, as described herein. As shown in FIG. 8A, the layer stack 800a, formed in process 310, may include a bottom diffusion barrier 430 and a layer to be annealed 802 disposed over the bottom diffusion barrier 430. The bottom diffusion barrier 430 may include at least one layer of the following group of layers: a tantalum layer, a titanium nitride layer, a titanium layer. According to various embodiments, the layer to be annealed 802 may include a plurality of regions including aluminum and a plurality of regions including titanium, such that during an annealing process a titanium aluminide is formed from the plurality of regions including aluminum and the plurality of regions including titanium. According to various embodiments, the layer to be annealed 802 may be a titanium aluminide layer being deposited by using a PVD-process, e.g. by using multiple targets and/or by using a titanium aluminide target. In other words, using one or more layering processes it may be possible to deposit a titanium aluminide layer forming at least part of the electrode 100, as described herein. Therefore, according to various embodiments, process 310 and process 320 of method 300 may be replaced by applying an appropriate deposition process or layering process forming directly a titanium aluminide layer.

As shown in FIG. 8B, the layer stack 800a, formed in process 310, may include a layer stack 802 including more than one titanium layer 802b and more than one aluminum layer 802a. According to various embodiments, the layer stack 802 may be annealed for forming a titanium aluminide layer. According to various embodiments, using a layer stack 802 including a plurality of titanium layers 802b and a plurality of aluminum layers 802a may allow forming a more homogeneous titanium aluminide layer 102 during an annealing process. According to various embodiments, the layer stack 802 including a plurality of titanium layers 802b and a plurality of aluminum layers 802a may further allow forming a layer stack configured as interference filter or dichroic filter.

According to various embodiments, the layer 428 or layer stack 428, as describe herein, being on top of the electrode may serve as an adhesion promoter and/or a diffusion barrier for an optoelectronic layer stack deposited on top of the electrode 100. Further, according to various embodiments, the layer 430 or the layer stack 430, as described herein, may serve as an adhesion promoter and/or a diffusion barrier for the electrode 100 being formed on top of for example a CMOS-structure.

Further, the electrode 100 may further include copper. According to various embodiments, the aluminum layer 426, 802a included in a layer stack to be annealed 802, e.g. formed in process 310, may include an aluminum/copper alloy, e.g. including 0.5 weight percent of copper. In other words, instead of using aluminum, as described herein, an aluminum alloy or aluminum compound may be used, e.g. aluminum/copper alloy.

According to various embodiments, the electrode 100 may further include impurities, which may not substantially reduce the desired functionality of the electrode 100, e.g. a small amount of oxygen, nitrogen and/or silicon.

FIG. 9A shows a schematic view of an optoelectronic structure 900a being disposed over the electrode 100 forming an electronic device 200 (optoelectronic device 200). The optoelectronic structure 900a may be an optoelectronic layer stack 900a providing a light emitting device. Therefore, the layer 100, e.g. the electrode 100 as described herein, may provide the bottom electrode providing a first type of charge carriers and the layer 970 may provide a second electrode providing a second type of charge carriers. According to various embodiments, the optoelectronic structure 900a may further include at least one electroluminescence layer 950 (or recombination layer 950), wherein the first type of charge carriers provided by the electrode 100 and the second type of charge carriers provided by the top electrode 970 may recombine under emission of light. According to various embodiments, the electrode 100 and the optoelectronic layer stack 900a may be formed over a substrate 912, e.g. over a CMOS-structure, as already described.

According to various embodiments, the first type of charge carriers may be holes and the second type of charge carriers may be electrons. In this case, the electrode 100 may be an anode and the second electrode 970 may be a cathode. According to another embodiment, the first type of charge carriers may be electrons and the second type of charge carriers may be holes. In this case, the electrode 100 may be a cathode and the second electrode 970 may be an anode.

According to various embodiments, one of the electrodes 100, 970 included in optoelectronic layer stack 900a may be transparent to light, wherein the other electrode of the electrodes 100, 970 may be configured to be highly reflective to light (to be a mirror). According to various embodiments, the first electrode 100 may be configured as described herein, reflecting light of the optoelectronic device 900. A second electrode may include for example an electrically conductive oxide (TCO) being substantially transparent to light, as already described. Depending on the arrangement of the electrode 100, the mirror electrode, and the transparent electrode 970, the optoelectronic device 900 may be a bottom emitting light emitting device or a top emitting light emitting device.

According to various embodiments, the electrode 100 may be the bottom (mirror) electrode 100 and the second electrode 970 may provide the (transparent) top electrode. According to various embodiments, the second electrode 970 may be transparent to the light emitted from the electroluminescence layer 950 (or at least partially transparent to the specific wavelengths being emitted from the electroluminescence layer 950), such that the electronic device 900 may be configured as a top emitting light emitting diode. According to various embodiments, the optoelectronic structure 900a may be formed over the electrode 100, as already described.

According to various embodiments, the electroluminescence layer 950 may include an inorganic light emitting layer, e.g. a semiconductor material including the desired band structure for emitting light while electrons and holes recombine within the electroluminescence layer 950. According to various embodiments, the inorganic light emitting layer may include at least one material of the following group of materials: Gallium (III) phosphide (GaP), Aluminum gallium indium phosphide (AlGaInP), Aluminum gallium phosphide (AlGaP), Indium gallium nitride (InGaN), Gallium (III) nitride (GaN), Gallium arsenide (GaAs), Aluminum gallium arsenide (AlGaAs).

According to various embodiments, the electroluminescence layer 950 may include an organic light emitting layer, e.g. an organic material including the desired band structure for emitting light while electrons and holes recombine within the electroluminescence layer 950. According to various embodiments, the electroluminescence layer 950 may be arranged between the first electrode 100 and the second electrode 970, as shown in FIG. 9A. According to various embodiments, the organic light emitting diode 900 may be configured as a top emitting organic light emitting diode. According to various embodiments, the electroluminescence layer 950 may be a layer stack including more than one electroluminescence layer. According to various embodiments, the electroluminescence layer stack may include at least to organic materials emitting light in a different color (or wavelength) range.

According to various embodiments, the organic light emitting layer may include at least one material of the following group of materials: small molecules (e.g. N,N'-Bis(3-methylphenyl)-N,N'-bis(phenyl)-benzidin or thieno [3,4-c]pyrrole-4,6-dione (TPD), Nitrile Butadiene Polymer (NBP), Aluminum-tris(8-hydroxychinolin) (Alq3), Biphen) and/or polymers (e.g. Poly(p-phenylen-vinylen) PPV or PPV derivate, Poly[2-methoxy-5-(2'-ethylhexyloxy)-p-phenylene vinylene] (MEH-PPV), Poly(1,4-phenylen) (PPP), substituted PPP, Poly(9,9'-dioctlyfluorene)) and derivate and/or substitutions of said material.

According to various embodiments, the optoelectronic structure 900a or the optoelectronic layer stack 900a shown in FIG. 9A may optionally include additional functional layers, as for example charge carrier injection layers 942, 962, charge carrier transport layers 944, 964, and/or charge carrier blocking layers 946, 966 (so called blocking layers). These additional functional layers may enhance the properties of the OLED structure 900a.

According to various embodiments, in case the OLED structure 900a may be a top emitting OLED, the electrode 100 may be the anode providing holes as charge carriers, the carrier injection layer 942 may be a hole injection layer 942 and the charge carrier transport layer 944 may be a hole transport layer 944, wherein the charge carrier blocking layer 946 may be an electron blocking layer 946. Further, the electrode 970 may be the cathode providing electrons as charge carriers, the carrier injection layer 962 may be an electron injection layer 962 and the charge carrier transport layer 964 may be an electron transport layer 964, wherein the charge carrier blocking layer 966 may be a hole blocking layer 966.

According to various embodiments, the hole transport layer 944 and the hole injection layer 942 may include at least one material of the following group of materials: NPB, TPD, or derivatives of NBP and TPD. According to various embodiments, electron transport layer 964 and the electron injection layer 962 may include at least one material of the following group of materials: FPF-BIm4, PFN-BIm4, Alga, oxadiazole molecule (2-(4-biphenyl)-5-(4-tert-butylphenyl)-1,3,4-oxadiazole (PBD), 2,5-bis(4-naphthyl)-1,3,4-oxadiazole (BND), PBD in a poly(methyl methacrylate) (PMMA) matrix.

According to various embodiments, there may be a huge number of possible organic or metal organic materials which may be used as charge carrier injection layers 942, 962, charge carrier transport layers 944, 964, and/or charge carrier blocking layers 946, 966.

According to various embodiments, the optoelectronic structure 900a or the optoelectronic layer stack 900a shown in FIG. 9A may include a capping layer 980 on top of the optoelectronic layer stack 900a, e.g. to protect the layer stack from environmental influences. Since the optoelectronic structure 900a may be a top emitting light emitting device, the capping layer 980 may be transparent to the light being emitted from the electroluminescence layer 950.

According to various embodiments, the highly reflective metallic electrode 100 may provide the primary layer of the OLED structure 900a formed over the electrode 100. Therefore, providing a high quality (e.g. a smooth and dense) electrode may enhance the functionality of the OLED layer stack 900a.

According to various embodiments, the organic materials formed over the electrode 100 may be applied by using a CVD process or a PVD process, or e.g. spin-coating, printing and the like.

According to various embodiments, the carrier 912 of the optoelectronic device 900 may include a complementary metal-oxide-semiconductor (CMOS) structure proving an integrated circuit. According to various embodiments, the integrated circuit may enable the control of the OLED structure 900a formed over the integrated circuit.

Since the OLED structure 900a may be formed over an integrated circuit 912, wherein the OLED structure 900a may be provided by forming a layer stack 900a on top of the integrated circuit 912, the efficiency of the OLED device 900 may depend on the morphology of the grown functional layers of the layer stack 900a. The functional layers (942, 944, 946, 950, 962, 964, 966, 970, 980) of the layer stack 900a may include at least one of an additional metallic contact layer at the bottom of the OLED layer stack (not shown), a hole transport layer (providing the electrical transport of the holes from an anode to the electroluminescent layer), an electroluminescent layer (generating light due to recombination of electrons and holes within the electroluminescent layer), an electron transport layer (providing the electrical transport of the electrons from an cathode to the electroluminescent layer), an electron blocking layer (preventing and/or hindering electrons reaching the anode), an hole blocking layer (preventing and/or hindering holes reaching the cathode). According to various embodiments, the out-coupled intensity of the light provided by an OLED on a CMOS-structure may be directly proportional to the reflectance of the metallic contact layer at the bottom side of the OLED, the mirror electrode 100. Besides the high reflectance, a very low surface roughness (e.g. smaller than 3 nm RMS) may be compulsory as for example a larger roughness may yield electrical field filaments in the hole transport layer (HTL) of the OLED and may cause subsequent degradation and/or an early fail of the optoelectronic device.

According to various embodiments, the electrode 100 may include at least one of the following layers or layer stacks: a titanium layer, an aluminum layer, a titanium nitride layer, a titanium/aluminum layer stack, a titanium/aluminum/titanium layer stack, and a titanium/aluminum/titanium/titanium nitride layer stack. According to various embodiments, the electrode 100 may a part of an OLED or OLED layer stack. According to various embodiments, the electrode 100 may a part of an OLED or OLED layer stack disposed on an integrated circuit (CMOS). According to various embodiments, the electrode 100 may be a highly reflective metallic contact layer e.g. for an organic light emitting diode. According to various embodiments, the electrode 100 may be an electrically conductive electrode, e.g. for an organic light emitting diode.

FIG. 9B shows a modified OLED layer stack 900b, including at least a anode 100 (electrode 100), a hole transport layer 942 being p-type doped, an emissive layer (e.g. emitting light), an electron transport layer 962 being n-type doped, and a cathode 970. According to another embodiment, the OLED layer stack 900b, may include at least a cathode 100 (electrode 100), an electron transport layer 942 being n-type doped, an emissive layer 950 (e.g. emitting light), a hole transport layer 962 being p-type doped, and a anode 970. According to various embodiments, the OLED layer stack 900b may further include an electron blocking layer and a hole blocking layer, (e.g. layer 944 and layer 964 as already described).

According to various embodiments, the p-type hole transport layer may include at least one material of the following group of materials: MTDATA, MeO-TPD, NPB, 2TNATA. According to various embodiments, the p-type hole transport layer may be doped by using at least one material of the following group of materials: $F_4TCNQ$, $WO_3$, $MoO_3$, and $V_2O_5$.

According to various embodiments, the n-type electron transport layer may include at least one material of the following group of materials: Bphen (Bphen 4,7-diphenyl-1,10-phenanthroline) and BCP (Bathocuproine). According to various embodiments, the n-type electron transport layer may be doped by using at least one material of the following group of materials: Li, Cs, and $Cs_2Co_2$.

According to various embodiments, the emissive layer 950 may include at least one material of the following group of materials:
IrPPy (Iridium, tris[2-(2-pyridinyl-κN)phenyl-κC]),
TCTA (Tris(4-carbazoyl-9-ylphenyl)amine), TCTA:IrPPy, CBP (4,4'-N,N'-dicarbazole-biphenyl), CBP:IrPPy, TCTA:IrPPy/CBP:IrPPy, and
TCTA:IrPPy/TAZ:IrPPy, According to various embodiments, the hole blocking layer may include at least one material of the following group of materials: BCP, TPBi, Pphen.

According to various embodiments, the electron blocking layer may include at least one material of the following group of materials:
Spiro-TAD (2,2',7,7'-Tetrakis(diphenylamino)-9,9'-spirobifluorene),
TAPC (Di-[4-(N,N-ditolyl-amino)-phenyl]cyclohexane).

According to various embodiments, the electrode 100 or the electrode layer stack 400a, 500a, 600a, 700a, 800a, 900a may be formed by using a standard layering process in semiconductor industry, e.g. at least one of a physical vapor deposition process and a chemical vapor deposition process.

According to various embodiments, during an annealing process, e.g. at a temperature of about 400° C. for about 30 min, the titanium and the aluminum of the electrode layer stack 400a, 500a, 600a, 700a, 800a, 900a may form an intermetallic compound (e.g. a titanium aluminide) such that the aluminum crystals may be pinned and the aluminum crystal growth may be reduced and the aluminum induced hillock formation may be prevented or reduced.

According to various embodiments, the RMS roughness of the electrode 100 may be drastically reduced compared to common approaches, e.g. the RMS roughness may be in the range from about 1 nm to about 3 nm, e.g. smaller than 3 nm, e.g. smaller than 2 nm, e.g. in the range of about 2 nm. Further, according to various embodiments, the electrode 100 may include a layer (e.g. including aluminum, titanium, and/or titanium aluminide) having a thicknesses of about larger than 30 nm, e.g. in the range from about 50 nm to about 300 nm. Therefore, the electrode 100 may yield maximal material reflectance, similar to the reflectance of aluminum bulk material. According to various embodiments, the ability to increase the electrode thickness up to 300 nm or further may enable to manufacture the electrode and a bond pad in one step.

According to various embodiments, a layer of an organic semiconductor may be formed by using at least one of the following processes: physical vapor deposition, chemical vapor deposition, and spin-coating from a solution. Further the formed layer of an organic semiconductor may have polycrystalline morphology, nanocrystalline morphology, or an amorphous morphology. According to various embodiments, polycrystalline morphology and nanocrystalline morphology may include a plurality of crystallites, wherein the crystallites of the plurality of crystallites may have substantially a random orientation distribution. In other words, the crystallographic orientation of the crystallites may have a random spatial distribution.

FIG. 10A shows schematically a cross sectional view of an electronic device 1000 including an organic light emitting diode structure and an electrode 100, according to various embodiments. According to various embodiments, the electronic device 1000 may include at least one of the features and functionalities as described referring to at least one of the electrode 100, the substrate 912, the electronic circuit 212, the optoelectronic layer stack 900a, the optoelectronic structure 216, and the metallization structure 214. According to various embodiments, forming the electronic device 1000 may include at least one of the features and functionalities as described herein at least referring to at least one of the electrode 100, the substrate 912, the electronic circuit 212, the optoelectronic layer stack 900a, the optoelectronic structure 216, and the metallization structure 214.

According to various embodiments, the electronic device 1000 may be a part of a display or a display device, e.g. an OLED display or an OLED display device.

According to various embodiments, the electronic device 1000 may include for example an OLED structure 900 as described referring to FIG. 9A and FIG. 9B.

According to various embodiments, the electronic device 1000 may further include a capping layer 980, and a glass casing 1080. According to various embodiments, the top electrode 970, the capping layer 980 and the glass casing 1080 may transmit light, e.g. light being generated by the OLED structure 900a, 900b. According to various embodiments, as illustrated in FIG. 10B, the electronic device 1000 may include a color filter layer including for example regions 1090a, 1090b, 1090c having different colors or filtering different wavelength ranges of the light generated by the OLED structure 900a, 900b. According to various embodiments, the color filter layer may be disposed between the capping layer 980 and the glass casing 1080. According to various embodiments, the electrode 100 may be a pixel anode. According to various embodiments, the electronic device 1000 may include a plurality of pixel anodes 100.

As shown in FIG. 10C, the electrode 100 may be disposed over the substrate 912, or over the integrated circuit 212, or over the metallization structure 214. However, since the electrode 100 may be very smooth, as already described, this may enable forming an electrode 100 as schematically shown in FIG. 10D, wherein the electrode 100 may be formed within the substrate 912, or within the integrated circuit 212, or within the metallization structure 214. According to various embodiments, the upper surface of the electrode 100 may be aligned with the upper surface of the substrate 912, or the integrated circuit 212, or the metallization structure 214.

FIG. 10E shows an electronic device, in analogy to the electronic device 200, 900, 1000 as described before, including an electronic circuit 212, a metallization structure 214 at least one of over and in the electronic circuit 212, an electrode 100 at least one of over and in the metallization structure 214, an optoelectronic structure 216, 900a, 900b at least one of over and in the electrode 100, and a capping layer 1080 and/or an color filter layer 1090 at least one of over and in the optoelectronic structure 216, 900a, 900b, according to various embodiments.

According to various embodiments, the electronic device may be formed using standard processes in semiconductor industry, as already described.

According to various embodiments, the substrate 912 may be a semiconductor wafer or a semiconductor substrate or any other type of suitable carrier.

According to various embodiments, integrated circuit 212 may include a CMOS integrated circuit or a CMOS structure, as already described. According to various embodiments, the integrated circuit 212 may be a driver circuit 212 for an optoelectronic device, e.g. for the optoelectronic structure 216 of the electronic device, as shown for example in FIG. 10E. According to various embodiments, the integrated circuit 212 may be a driver circuit 212 for an OLED structure or another light emitting device, e.g. for the OLED structure 900a, 900b of the electronic device, as shown for example in FIG. 10E. According to various embodiments, the driver circuit 212 may be electrically coupled to the electrode 100 via the metallization structure 214, e.g. a back-end-of line metallization structure, e.g. including an insulating low-k or high-k material structure, and an electrically conductive wiring structure including a single or multilevel wiring and a plurality of vias. According to various embodiments, the wiring structure may include aluminum technology wiring and/or copper technology wiring or any other suitable wiring technique (e.g. using layering, printing, spray coating, spin coating, and the like). According to various embodiments, at least one via 214v may electrically connect the electrode 100 and the metallization structure 214 and, therefore, the electrode 100 and the electronic circuit 212. According to various embodiments, the at least one via 214v may include tungsten. According to various embodiments, the metallization structure 214 may include at least one silicon oxide (silicon dioxide) layer 214i, e.g. being electrically insulating. According to various embodiments, at least one polishing process may be carried out after the metallization structure 214 has been formed, e.g. a chemical mechanical polishing (CMP).

According to various embodiments, the electrode 100 shown in FIG. 10E may be an electrode 100 as described herein, e.g. referring to FIGS. 1A to 1E, FIG. 4B, FIG. 5B, FIG. 6B, and/or FIG. 7B. The electrode 100 may further include copper, which may be included in such an amount, that the formation of a smooth electrode 100 may be preserved, as already described. According to various embodiments, the electrode 100 may include a bottom layer 430 such that the interface between the electrode 100 and the metallization structure 214 may have the desired properties, e.g. surface roughness, mechanical cohesion, diffusion properties, chemical properties (oxygen and water affinity). According to various embodiments, the electrode 100 may include a top layer 428 such that the interface between the electrode 100 and the OLED structure 900a, 900b or the electronic structure 216 may have the desired properties, e.g. surface roughness, mechanical cohesion, diffusion properties, chemical properties (oxygen and water affinity).

According to various embodiments, the electronic device, as shown in FIG. 10E, may further include a glass cover layer 1080 or a glass casing 1080. According to various embodiments, the electronic device may be a display device or a light emitting device (a lamp). According to various embodiments, the electronic device may further include a color filter 1090 to provide light having different wavelengths, e.g. in the case the OLED structure 900a, 900b may be configured to produce not the desired wavelength or the OLED structure 900a, 900b may be configured to produce substantially monochromatic light.

According to various embodiments, the OLED structure 900a, 900b may be a load structure electrically coupled to the electrode 100. Further, according to various embodiments, the electrode 100 may be configured to provide a driver current from the driver circuit 212 to the OLED structure. According to various embodiments, the electronic device 216, as describe herein, may be a load structure electrically coupled to the electrode 100. According to various embodiments, optoelectronic device, as describe herein, may be a load structure electrically coupled to the electrode 100.

According to various embodiments, the driver circuit 212 may control a plurality of OLEDs included in an electronic device, e.g. a display device or a lamp. According to various embodiments, the electrode 100, as described herein, may control a plurality of electronic structures 216 included in an electronic device.

According to various embodiments, the electrode 100, as described herein, may be used as an electrode for an organic solar cell, e.g. a bilayer organic photovoltaic cells including for example at least two different functional layers in between the conductive electrodes. The materials of the at least two different functional layers may include one layer with a higher electron affinity (the electron acceptor), and one layer configured as an electron donor. According to various embodiments, the electronic structure 216 may be a planar donor-acceptor hetero-junction.

According to various embodiments, the electrode 100 and the optoelectronic structure 216, 900a, 900b may be formed at least one of over and in a carrier, e.g. an organic carrier, a polymer carrier, a flexible carrier, a metal carrier, e.g. a metal foil and the like. According to various embodiments, the carrier may be transparent or at least partially transparent. According to various embodiments, the carrier may allow a reel-to-reel processing of the electronic device or of the electrode 100, as described herein.

According to various embodiments, an electrode may include: at least one layer including a chemical compound including or based on aluminum and titanium.

According to various embodiments, an electrode may include: at least one layer including a chemical compound including or based on aluminum, titanium, and copper.

According to various embodiments, the at least one layer may include an intermetallic chemical compound including aluminum and titanium. According to various embodiments, the at least one layer may include an intermetallic chemical compound including aluminum, titanium, and copper.

According to various embodiments, the at least one layer may include a chemical alloy including aluminum and titanium. According to various embodiments, the at least one layer may include a chemical alloy including aluminum, titanium, and copper.

According to various embodiments, the at least one layer may include titanium aluminide ($Ti_xAl_y$).

According to various embodiments, the copper content of the electrode 100 may be smaller than about 10 weight percent, e.g. smaller than about 5 weight percent, e.g. smaller than about 1 weight percent, e.g. smaller than about 0.5 weight percent.

According to various embodiments, the at least one layer may include a titanium aluminide compound ($A_xB_yC_z$, wherein A may be titanium and B may be aluminum, and wherein C may be at least one additional material or element).

According to various embodiments, the electrode may further include a titanium nitride layer disposed over the at least one layer.

According to various embodiments, the electrode may further include a tantalum layer disposed over the at least one layer. According to various embodiments, the electrode may further include a tantalum layer and a titanium nitride layer disposed over the at least one layer.

According to various embodiments, at least one surface of the electrode may have a RMS roughness of equal to or less than 3 nm. According to various embodiments, at least one surface of the electrode may have a RMS roughness of equal to or less than 2 nm.

According to various embodiments, an electronic device may include: an electronic circuit; and an electrode including at least one layer including a chemical compound including or based on aluminum and titanium; wherein the electrode may be electrically coupled with the electronic circuit.

According to various embodiments, an electronic device may include: an electronic circuit; and an electrode including at least one layer including a chemical compound including or based on aluminum, titanium, and copper; wherein the electrode may be electrically coupled with the electronic circuit.

According to various embodiments, the electronic circuit may include a complementary metal oxide semiconductor circuit.

According to various embodiments, the electronic circuit may be electrically coupled to the at least one electrode via a metallization structure. According to various embodiments, the electronic circuit may be electrically coupled to the at least one electrode via a multilevel metallization structure, for example a back-end-of-line multilevel metallization structure.

According to various embodiments, the electronic device may further include an optoelectronic structure being electrically conductively coupled to the electrode.

According to various embodiments, the electronic device may further include an optoelectronic structure being electrically conductively coupled to the electrode via a metallization structure, e.g. a back-end-of-line multilevel metallization structure.

According to various embodiments, the optoelectronic structure may be configured as an optoelectronic device selected from a group of optoelectronic devices consisting of: a light emitting device; a photovoltaic cell; and an optoelectronic sensor.

According to various embodiments, the optoelectronic structure may include at least one light emitting diode.

According to various embodiments, the at least one light emitting diode may be configured as an organic light emitting diode.

According to various embodiments, an electronic device may include: a driver circuit; and an electrode coupled to the driver circuit, the electrode including at least one layer including a chemical compound including or based on aluminum and titanium, a load structure being electrically coupled to the electrode; wherein the electrode may be configured to provide a driver current from the driver circuit to the load structure.

According to various embodiments, an electronic device may include: a driver circuit; and an electrode coupled to the driver circuit, the electrode including at least one layer including a chemical compound including or based on aluminum, titanium, and copper, a load structure being electrically coupled to the electrode; wherein the electrode may be configured to provide a driver current from the driver circuit to the load structure.

According to various embodiments, the driver circuit may include a complementary metal oxide semiconductor circuit.

According to various embodiments, the driver circuit may be electrically coupled to the at least one electrode via a metallization structure of a back-end-of line structure.

According to various embodiments, the load structure may include an optoelectronic structure.

According to various embodiments, the optoelectronic structure may be configured as an optoelectronic device selected from a group of optoelectronic devices consisting of: a light emitting device; a photovoltaic cell; and an optoelectronic sensor.

According to various embodiments, the optoelectronic structure may include at least one light emitting diode.

According to various embodiments, the at least one light emitting diode may be configured as an organic light emitting diode.

According to various embodiments, a method for manufacturing an optoelectronic device may include: forming an electrode layer stack, the electrode layer stack including at least a titanium layer and an aluminum layer; annealing the electrode layer stack such that a chemical compound may be formed from the aluminum of the aluminum layer and the titanium of the titanium layer; and forming an optoelectronic structure over the electrode layer stack, wherein the optoelectronic structure may be electrically conductively coupled to the electrode layer stack.

According to various embodiments, a method for manufacturing an optoelectronic device may include: forming an electrode layer stack, the electrode layer stack including at least a titanium layer and an aluminum/copper layer (e.g. a layer including aluminum and copper or an aluminum/copper alloy); annealing the electrode layer stack such that a chemical compound may be formed from the aluminum of the aluminum layer and the titanium of the titanium layer; and forming an optoelectronic structure over the electrode layer stack, wherein the optoelectronic structure may be electrically conductively coupled to the electrode layer stack.

According to various embodiments, forming the electrode layer stack may include: forming a first titanium layer and forming an aluminum layer over the first titanium layer.

According to various embodiments, forming the electrode layer stack may include: forming a first titanium layer; forming an aluminum layer over the first titanium layer; and forming a second titanium layer over the aluminum layer.

According to various embodiments, forming the electrode layer stack may include: forming a first titanium layer; forming an aluminum/copper layer (e.g. a layer including aluminum and copper or an aluminum/copper alloy) over the first titanium layer; and forming a second titanium layer over the aluminum/copper layer.

According to various embodiments, forming the electrode layer stack may include: forming a first titanium layer and forming an aluminum/copper layer (e.g. a layer including aluminum and copper or an aluminum/copper alloy) over the first titanium layer.

According to various embodiments, forming an electrode layer stack may further include forming a titanium nitride layer over the second titanium layer of the electrode layer stack.

According to various embodiments, forming an electrode layer stack may further include forming a titanium nitride layer over the aluminum layer of the electrode layer stack. According to various embodiments, forming an electrode layer stack may further include forming a titanium nitride layer over the aluminum/copper layer (e.g. a layer including aluminum and copper or an aluminum/copper alloy) of the electrode layer stack.

According to various embodiments, forming an electrode layer stack may further include forming a tantalum layer over the second titanium layer of the electrode layer stack.

According to various embodiments, forming an electrode layer stack may further include forming a tantalum layer over the aluminum layer of the electrode layer stack. According to various embodiments, forming an electrode layer stack may further include forming a tantalum layer over the aluminum/copper layer (e.g. a layer including aluminum and copper or an aluminum/copper alloy) of the electrode layer stack.

According to various embodiments, forming an electrode layer stack may further include forming a titanium nitride layer over the electrode layer stack including at least one titanium layer and at least one aluminum layer. According to various embodiments, forming an electrode layer stack may further include forming a titanium nitride layer over the electrode layer stack including at least one titanium layer and at least one aluminum/copper layer (e.g. a layer including aluminum and copper or an aluminum/copper alloy).

According to various embodiments, forming an electrode layer stack may further include forming a tantalum layer over the electrode layer stack including at least one titanium layer and at least one aluminum layer. According to various embodiments, forming an electrode layer stack may further include forming a tantalum layer over the electrode layer stack including at least one titanium layer and at least one aluminum/copper layer (e.g. a layer including aluminum and copper or an aluminum/copper alloy).

According to various embodiments, a method for manufacturing an optoelectronic device may further include forming a barrier layer before the electrode layer stack is formed. According to various embodiments, the barrier layer may include at least one layer of the following group of layers consisting of: a titanium nitride layer, a tantalum layer. According to various embodiments, a barrier layer may include at least one material of the following group of materials consisting of: nickel, chromium, nichrome, hafnium, niobium, vanadium, cobalt, ruthenium, tantalum, tantalum nitride, indium oxide, tungsten nitride, and titanium nitride. According to various embodiments, the barrier layer may be at least one of a diffusion barrier layer and an adhesion promoter layer.

According to various embodiments, a barrier layer may be formed over the electrode layer stack or over the electrode.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing an optoelectronic device, the method comprising:
    forming an electrode layer stack, the electrode layer stack comprising at least a titanium layer and an aluminum layer;
    annealing the electrode layer stack such that a chemical compound is formed from the aluminum of the aluminum layer and the titanium of the titanium layer; and
    forming an optoelectronic structure over the electrode layer stack, wherein the optoelectronic structure is electrically conductively coupled to the annealed electrode layer stack,
    wherein forming the electrode layer stack further comprises forming a titanium nitride layer directly on the titanium layer.

2. The method according to claim 1,
    wherein forming the electrode layer stack comprises:
        forming a first titanium layer;
        forming an aluminum layer over the first titanium layer; and
        forming a second titanium layer over the aluminum layer.

3. The method according to claim 2,
    wherein forming the electrode layer stack further comprises forming a titanium nitride layer directly on the second titanium layer.

4. The method according to claim 1,
    wherein forming the electrode layer stack further comprises forming a top layer over the titanium layer and the aluminum layer.

5. The method according to claim 4,
    wherein the top layer comprises at least one of tantalum and titanium nitride.

6. The method according to claim 4,
    wherein the top layer provides an upper surface of the electrode layer stack.

7. The method according to claim 1,
    wherein the optoelectronic structure is configured as an optoelectronic device selected from a group of optoelectronic devices consisting of:
        a light emitting device;
        a photovoltaic cell; and
        an optoelectronic sensor.

8. The method according to claim 1,
    wherein the optoelectronic structure comprises at least one light emitting diode.

9. The electronic device according to claim 8,
    wherein the at least one light emitting diode is configured as an organic light emitting diode.

10. The method according to claim 1, further comprising:
    forming an electronic circuit, wherein the electronic circuit is electrically coupled with the annealed electrode layer stack.

11. The method according to claim 10,
    wherein the electrode layer stack is formed to reflect light emitted by the optoelectronic structure.

12. A method for manufacturing an electrode, the method comprising:
    forming an electrode layer stack, the electrode layer stack comprising at least one titanium layer and at least one aluminum layer; subsequently annealing the electrode layer stack such that a chemical compound is formed from the aluminum of the at least one aluminum layer and the titanium of the at least one titanium layer, wherein forming the electrode layer stack comprises forming a bottom layer comprising at least one of tantalum and titanium nitride.

13. The method according to claim 12,
wherein forming the electrode layer stack comprises:
   forming a first titanium layer;
   forming an aluminum layer over the first titanium layer; and
   forming a second titanium layer over the aluminum layer.

14. The method according to claim 13, further comprising:
   wherein forming the electrode layer stack further comprises forming a titanium nitride layer directly on the second titanium layer.

15. A method for manufacturing an electrode, the method comprising:
   forming a bottom layer, the bottom layer comprising at least one of tantalum and titanium nitride;
   forming at least one layer of the bottom layer, the at least one layer comprising aluminum and titanium;
   forming a top layer over the at least one layer, the top layer comprising at least one of tantalum and titanium nitride; and subsequently
   annealing the at least one layer such that a chemical compound is formed from the aluminum and the titanium of the at least one layer.

16. A method for manufacturing an electrode, the method comprising:
   forming an electrode layer stack, the electrode layer stack comprising at least one titanium layer and at least one aluminum layer; subsequently
   annealing the electrode layer stack such that a chemical compound is formed from the aluminum of the at least one aluminum layer and the titanium of the at least one titanium layer,
   wherein forming the electrode layer stack comprises forming a top layer comprising at least one of tantalum and titanium nitride.

17. The method according to claim 16,
wherein the top layer provides an upper surface of the electrode layer stack.

* * * * *